(12) United States Patent
Credelle et al.

(10) Patent No.: US 6,731,353 B1
(45) Date of Patent: May 4, 2004

(54) METHOD AND APPARATUS FOR TRANSFERRING BLOCKS

(75) Inventors: Thomas L. Credelle, Morgan Hill, CA (US); Omar Alvarado, Santa Clara, CA (US); Gordon S. W. Craig, Palo Alto, CA (US); Mark A. Hadley, Newark, CA (US); Kenneth D. Schatz, San Jose, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 10/144,166

(22) Filed: May 10, 2002

Related U.S. Application Data

(63) Continuation-in-part of application No. 09/932,409, filed on Aug. 17, 2001.

(51) Int. Cl.[7] .................. G02F 1/136; G02F 1/1333; H01L 21/44; H01L 21/30; H01L 23/34
(52) U.S. Cl. .................. 349/45; 349/158; 438/107; 438/455; 257/723
(58) Field of Search ............... 349/45, 158; 438/22–24, 438/106, 107, 455; 428/209; 361/737, 760; 257/723, 688, 690

(56) References Cited

U.S. PATENT DOCUMENTS

| 3,349,416 A | 4/1969 | Yando |
| 4,191,800 A | 3/1980 | Holtzman |
| 4,514,583 A | 4/1985 | Izu et al. |
| 4,966,442 A | 10/1990 | Ono et al. |
| 5,034,802 A | 7/1991 | Liebes, Jr. et al. |
| 5,436,744 A | 7/1995 | Arledge et al. |
| 5,453,864 A | 9/1995 | Yamada et al. |
| 5,545,291 A | 8/1996 | Smith et al. |
| 5,824,186 A | 10/1998 | Smith et al. |
| 5,904,545 A | 5/1999 | Smith et al. |
| 6,091,332 A | 7/2000 | Eberhardt et al. |
| 6,094,138 A | 7/2000 | Eberhardt et al. |
| 6,246,327 B1 | 6/2001 | Eberhardt |
| 6,274,508 B1 | 8/2001 | Jacobsen et al. |
| 6,281,038 B1 | 8/2001 | Jacobsen et al. |
| 6,291,896 B1 * | 9/2001 | Smith .......................... 257/786 |
| 6,316,278 B1 | 11/2001 | Jacobsen et al. |
| 6,468,638 B2 | 10/2002 | Jacobsen et al. |
| 6,606,247 B2 * | 8/2003 | Credelle et al. ............ 361/737 |
| 2001/0031514 A1 | 10/2001 | Smith et al. |

FOREIGN PATENT DOCUMENTS

| EP | 0747948 | 12/1996 |
| JP | 8-160466 | 6/1996 |
| WO | WO 99/67678 | 12/1999 |

OTHER PUBLICATIONS

Nakamura, E., et al., "Development of Electrophorectic Display Using Microcapsulated Suspension; SID International Symposium Digest Of Technical Papers," Santa Ana, CA Vol 29., 1998, pp. 1014–1017.

Wu, C, et al., "Integration of Organic LED's and Amorphous Si TFT's onto Flexible and Lightweight Metal Foil Substrates," IEEE Electron Device Letters, US, IEEE, Inc., New York, vol. 18, No. 12, Dec. 1, 1997, pp. 609–612.

* cited by examiner

Primary Examiner—Tarifur R. Chowdhury
(74) Attorney, Agent, or Firm—Blakely, Sokoloff, Taylor & Zafman LLP

(57) ABSTRACT

An apparatus and methods of using the same for transferring functional blocks to a substrate. In one exemplary embodiment, a plurality of functional blocks is deposited in a relocating tool having a first plurality of receptor sites. A transfer tool having a plurality of nozzles in aligning with the first plurality of receptor sites removes the plurality of functional blocks from the relocating tool. The transfer tool then deposits the plurality of functional blocks into a second plurality of receptor sites in a substrate. The receptor sites comprise adhesives for securing the functional blocks. Vibration and water are used to facilitate proper delivery of the functional blocks to the receptor sites.

18 Claims, 23 Drawing Sheets

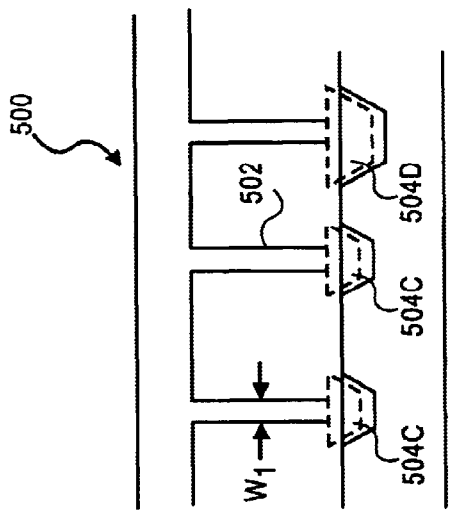
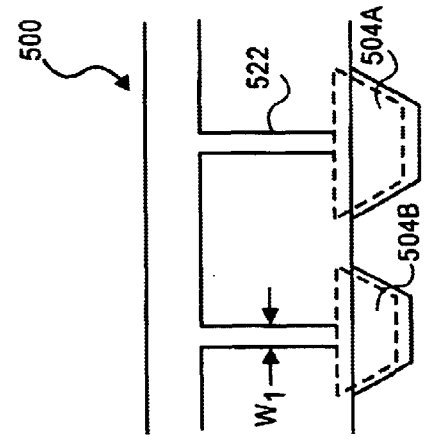
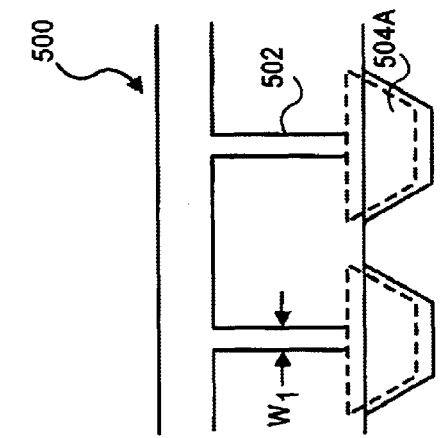
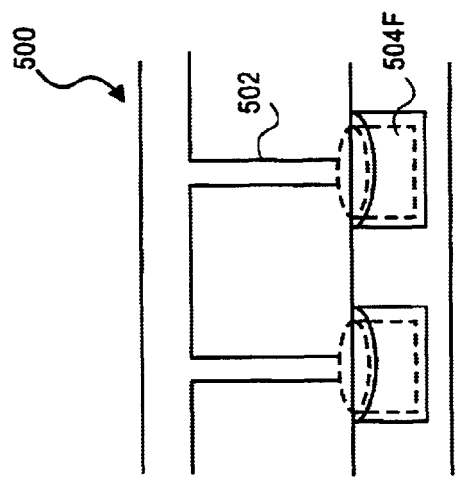

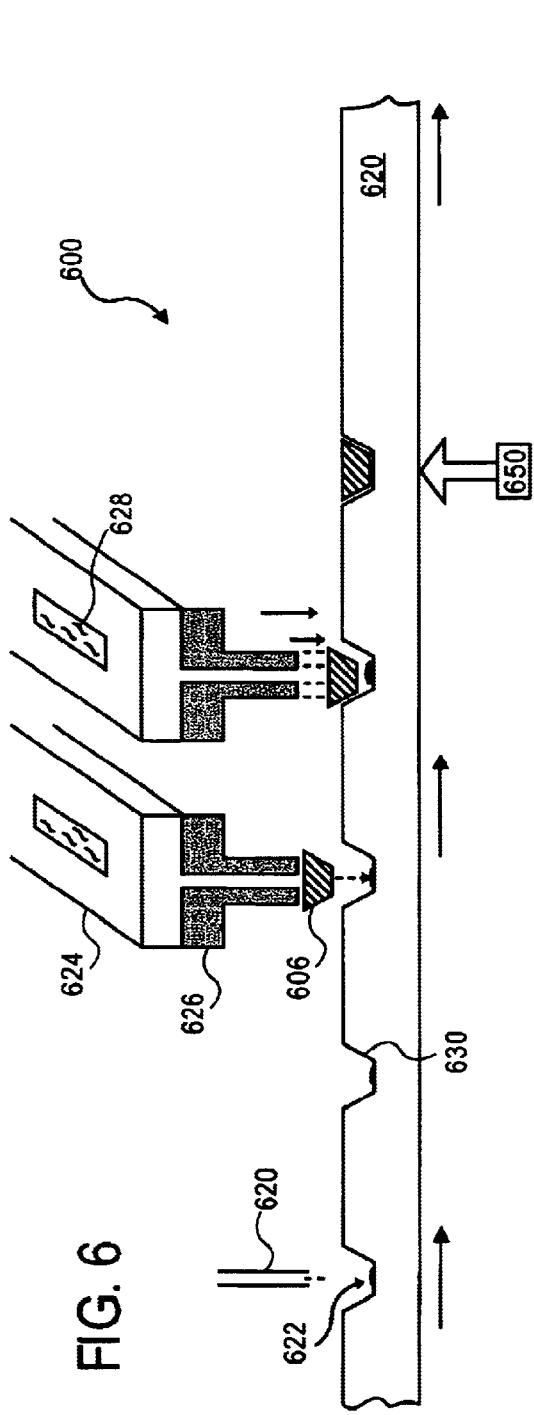
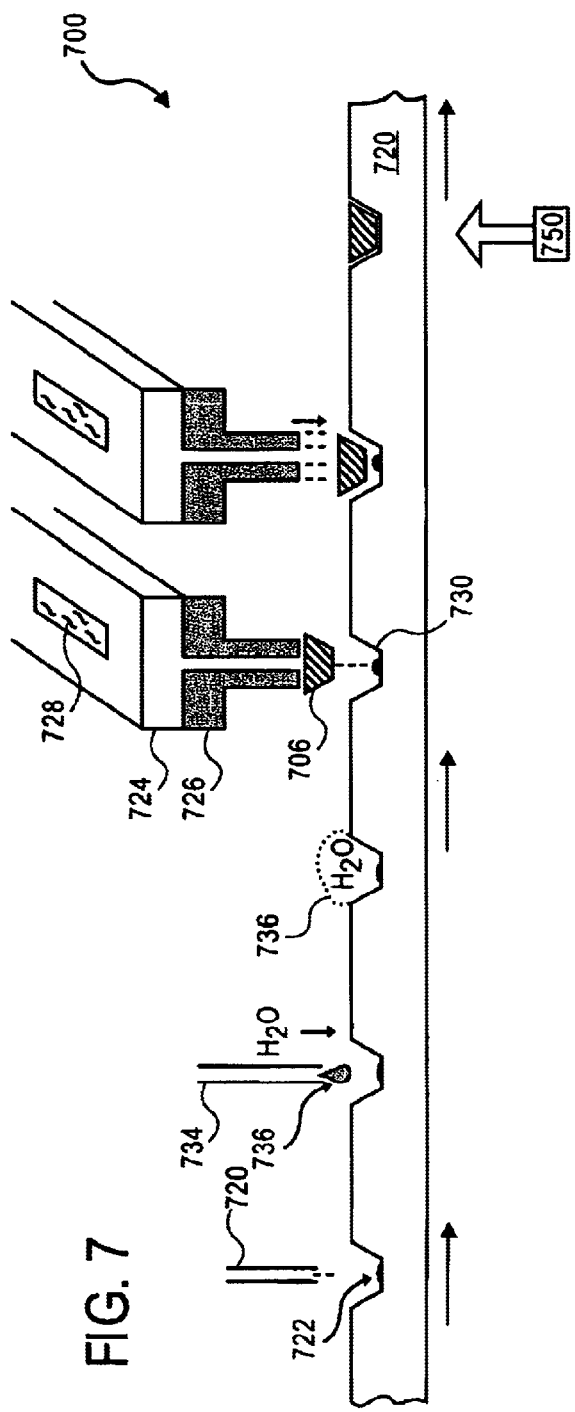

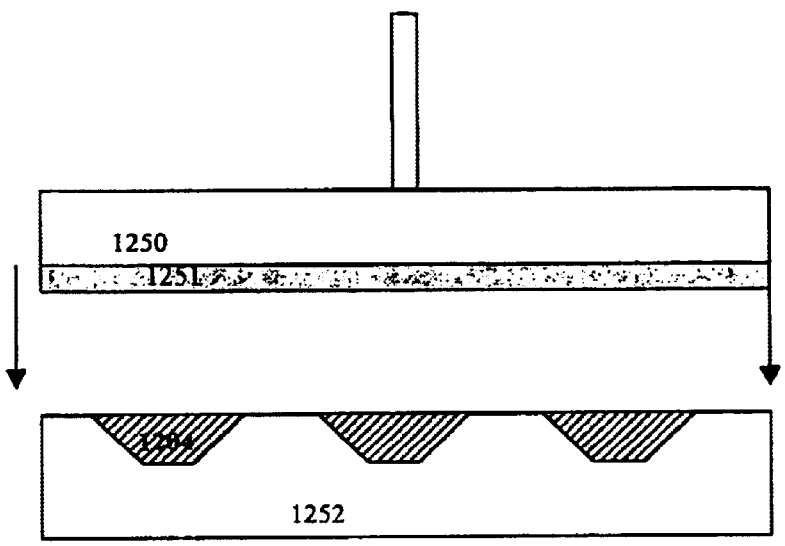
FIG 12C (1)
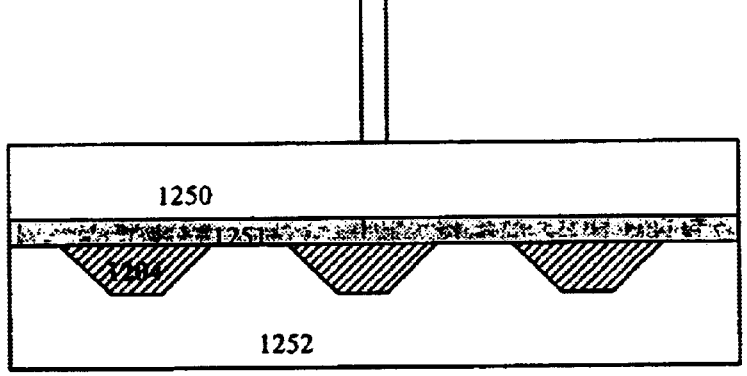
FIG 12C (2)
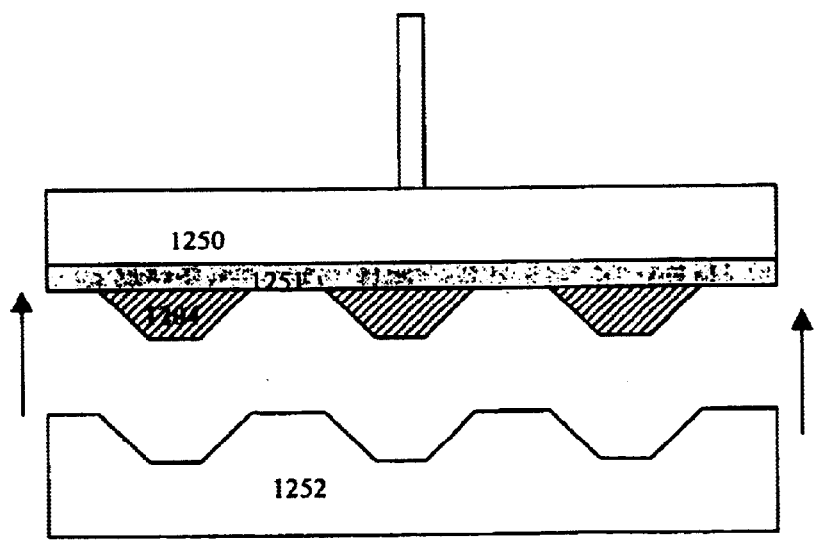
FIG 12C (3)

FIG 12C(4)
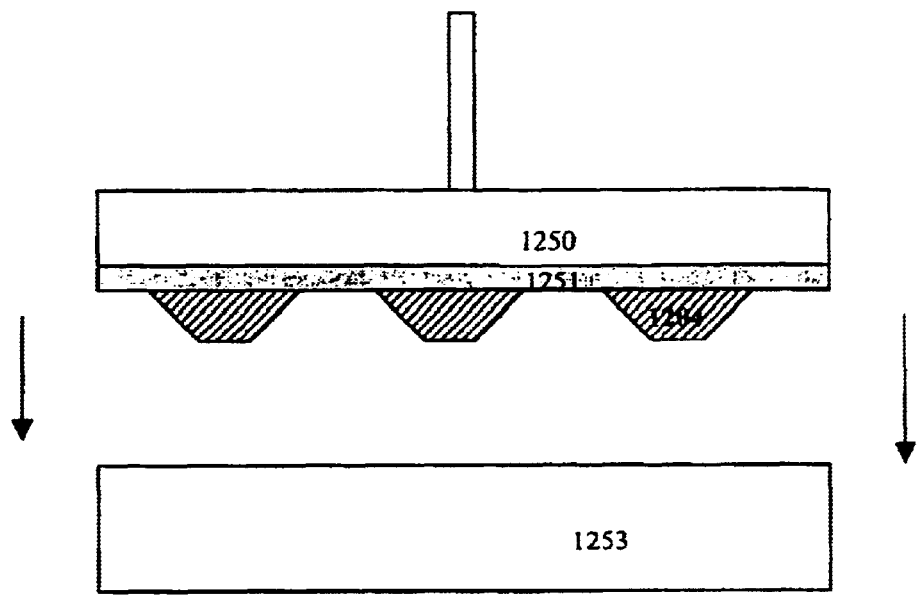
FIG 12C(5)
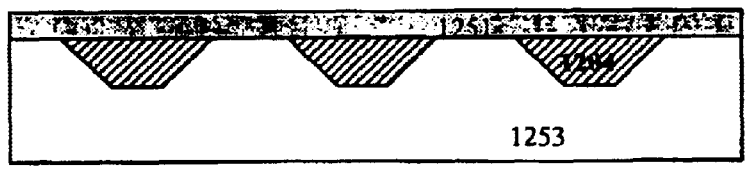

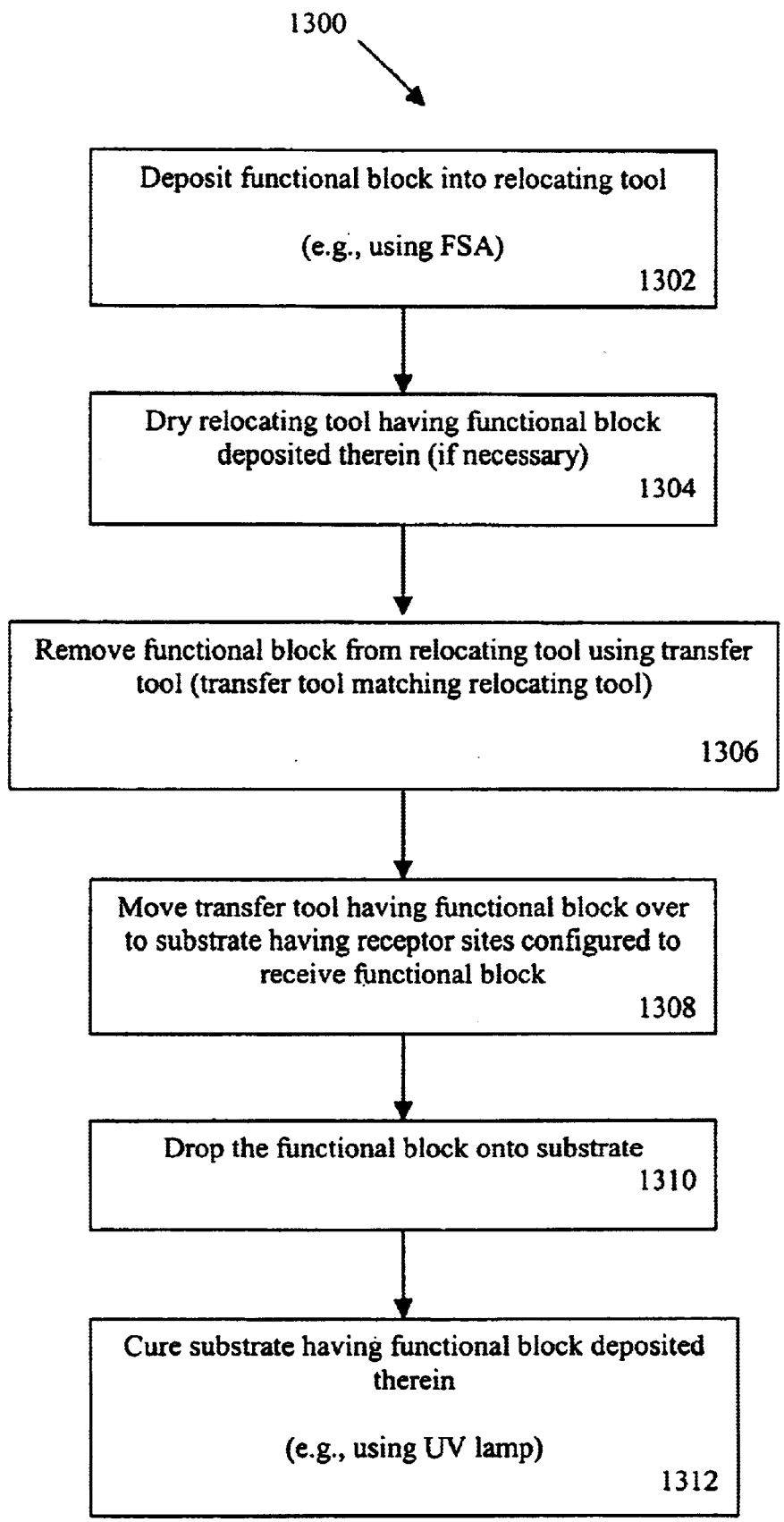

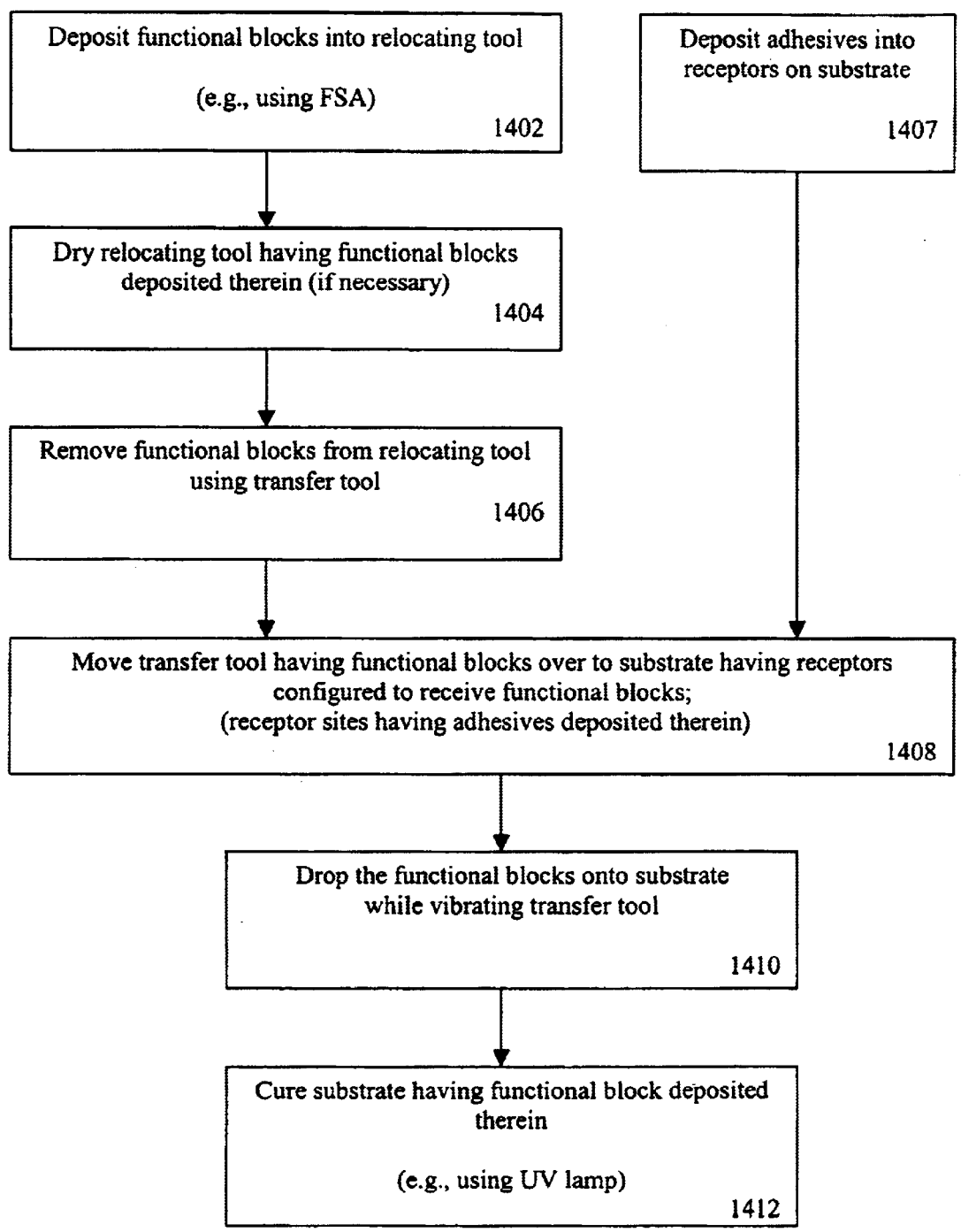

METHOD AND APPARATUS FOR TRANSFERRING BLOCKS

REFERENCE TO RELATED APPLICATION

This is a continuation in part of application Ser. No. 09/932,409 filed on Aug. 17, 2001 entitled "Web Fabrication of Devices." This application is hereby incorporated by reference.

BACKGROUND

1. Field of the Invention

The present invention relates generally to a method and an apparatus for distributing particles. More specifically, the invention relates to a method and an apparatus for transferring particles such as blocks to form electronic assemblies.

2. Background

The manufacture of electronic assemblies such as display panels is known in the art. One such method involves using fluidic self-assembly (FSA) that is described in U.S. Pat. No. 5,545,291. FIG. 1 illustrates that in FSA, blocks 102 with integrated circuits thereon are placed into a FSA fluid 104 such as water. The combination of the blocks 102 in the FSA fluid 104, referred to as a slurry 106, is dispensed over recessed regions 108 in a substrate 110. The recessed regions 108 receive the plurality of blocks 102 and the blocks 102 are subsequently electrically coupled.

Although FSA has provided advantages to electronic device manufacturers such as the increased speed of assembling an electronic device, several drawbacks may be associated with the FSA process. For instance, some blocks may fall to the surface of the substrate without settling into recessed regions. Blocks not settling into the recessed regions may be due to the weight of some blocks being heavier than the fluid causing the blocks to fall to the surface of the substrate in which a recessed region does not exist. Alternatively, some blocks may be dislodged from the recessed regions even after having been deposited into these regions. Blocks being dislodged from the recessed regions may be due to additional treatment to the substrate such as cleaning and removing excess blocks.

Having the blocks not being properly deposited into the recessed regions is problematic because devices manufactured with the recessed regions that lack a block generally operate less efficiently compared to devices in which all of the blocks have been properly placed. Improperly placed or absent blocks also lead to a lower overall production yield. A manufacturer may solve this problem by using a variety of methods. For example, the FSA process may be used a second time over the empty recessed regions. Applying a second FSA process, however, is expensive because it would require additional processing time, larger processing equipment in some cases, and additional blocks.

Another method involves using a robot to place a block into a particular recessed region. Typically the robot may not place more than one block into one of the recessed regions. Additionally, a typical robot system only has a 625 μm accuracy. Moreover, using the robot is a time consuming and expensive process; for instance, a typical robot system has a placement speed of 2000–3000 units per hour.

BRIEF DESCRIPTION OF THE DRAWINGS

The present invention is illustrated by way of example and not limitation in the figures of the accompanying drawings, in which like references indicate similar elements, and in which:

FIGS. 5A to 5E illustrate an example of a transfer tool being used to transfer blocks of various sizes and various shapes into substrates having complimentary receptor sites to those various sized and shaped blocks;

FIG. 6 illustrates a schematic diagram of an exemplary apparatus having a process line where adhesives are deposited into receptor sites in a substrate before blocks are deposited into the substrate;

FIG. 7 illustrates a schematic diagram of an exemplary apparatus having a process line where adhesives are deposited into receptor sites, and water droplets are deposited over the receptor sites of a substrate before blocks are deposited into the substrate;

FIGS. 12C(1)–(5) illustrates a schematic diagram of an exemplary apparatus having a process line where a transfer tool uses an adhesive film attached thereto to transfer blocks to a substrate;

FIG. 13 illustrates an exemplary method of using a transfer tool to facilitate deposition of blocks into a substrate;

FIG. 14 illustrates an exemplary method of using a transfer tool to facilitate deposition of blocks into a substrate wherein receptor sites in the substrate have adhesives deposited therein;

DETAILED DESCRIPTION

Figure 1:
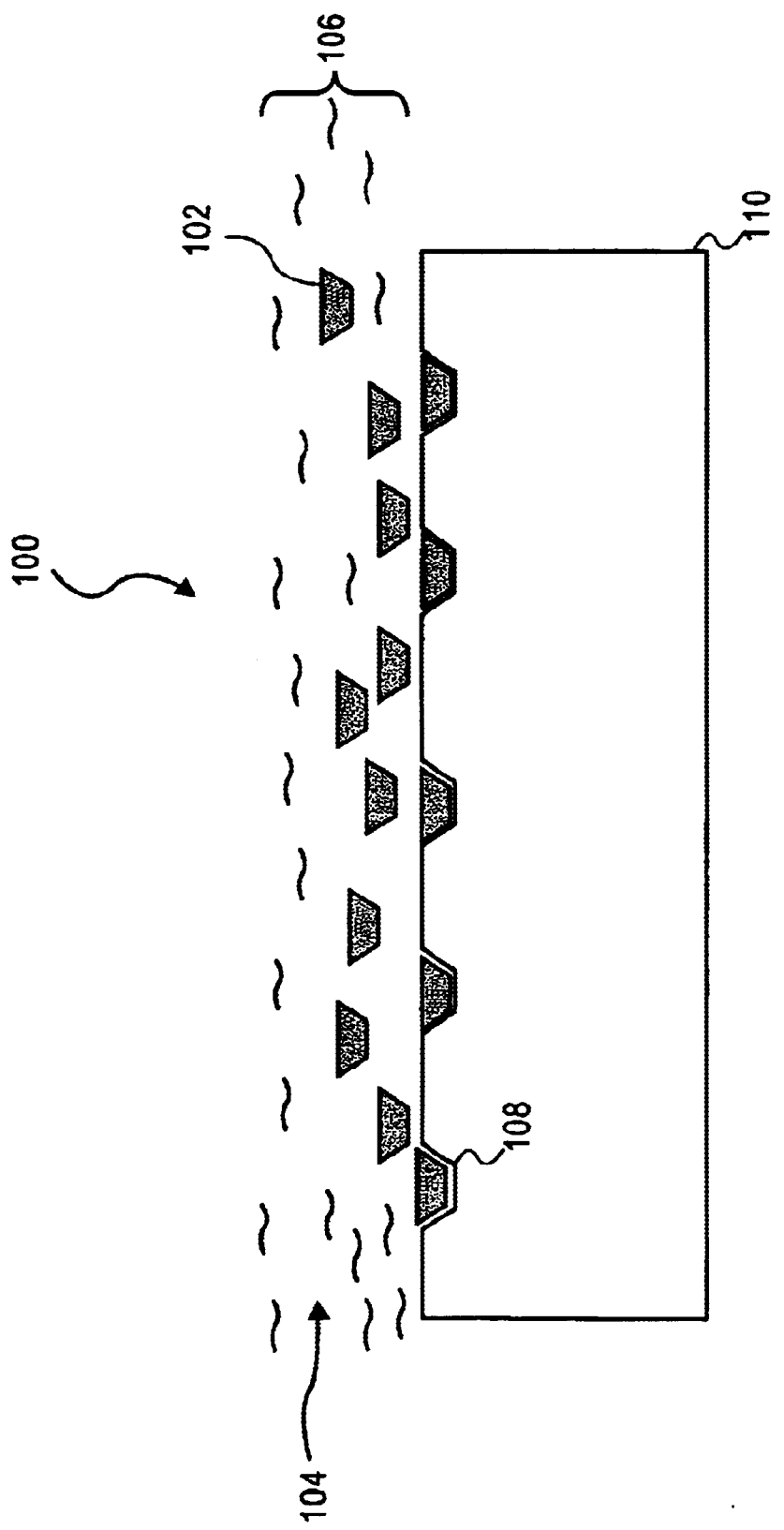
FIG. 1 illustrates that FSA is used with a slurry having blocks to deposit these blocks into a substrate having recessed regions.

In the following description, numerous specific details such as specific materials, processing parameters, processing steps, etc., are set forth in order to provide a thorough understanding of the invention. One skilled in the art will recognize that these details need not be specifically adhered in order to practice the claimed invention. In other instances, well known processing steps, materials, etc., are not set forth in order not to obscure the invention.

The present invention relates to methods and apparatuses of depositing functional blocks to a substrate. In more particular, the exemplary embodiments combine a transfer tool and FSA techniques to deposit functional blocks to a substrate. The exemplary embodiments describe apparatuses used to perform the deposition of the functional blocks into the substrate. The exemplary embodiments further relate to methods and apparatuses of securing the blocks into the substrate.

In one exemplary embodiment, a plurality of functional blocks is deposited in a relocating tool having a first plurality of receptor sites. A transfer tool having a plurality of nozzles that are in alignment with the first plurality of receptor sites removes the plurality of functional blocks from the relocating tool. The transfer tool then deposits the plurality of functional blocks into a second plurality of receptor sites in a substrate. Alternatively, the receptor sites may comprise adhesives for securing the functional blocks. Vibration and water may be used to facilitate proper delivery of the functional blocks to the receptor sites.

In another example, the transfer tool deposits the plurality of functional blocks to a substrate made out of a thermoset or a thermoplastic material that has been heated. The transfer tool deposits the functional blocks by pressing the functional blocks into the heated thermoset substrate or the thermoplastic substrate.

In another exemplary embodiment, a plurality of functional blocks having circuitry components is formed on a surface of a first substrate in which the circuitry components for the functional blocks are facing the surface of the substrate. A transfer tool having a plurality of nozzles remove the plurality of functional blocks from the substrate. The plurality of nozzles attaches to the non-circuit sides of the functional blocks. The functional blocks are inverted at a transfer station. The transfer tool picks up the inverted functional blocks such that the circuit sides of the functional blocks now attach to the plurality of nozzles. The functional blocks are deposited to a second substrate with the circuit sides facing upward from the substrate.

In another exemplary embodiment, a plurality of functional blocks having circuitry components is formed on a surface of a first substrate in which the circuitry components for the functional blocks are facing the surface of the substrate. A transfer tool having a plurality of nozzles remove the plurality of functional blocks from the substrate. The plurality of nozzles attaches to the non-circuit sides of the functional blocks. The functional blocks are inverted at a transfer station. The transfer tool picks up the inverted functional blocks such that the circuit sides of the functional blocks now attach to the plurality of nozzles. The functional blocks are attached to a carrier having a photopatternable film. A material is deposited over the plurality of blocks that are attached to the carrier to form a second substrate supporting the blocks. Vias for electrical interconnections are then formed in the photopatternable film.

In all of the embodiments to be discussed below, the functional block has a top surface upon which at least one circuit element is situated. The circuit element on the top surface of the functional block may be an ordinary integrated circuit (IC) for any particular function. For example, the IC may be designed to drive a pixel of a display. The IC may also be designed to receive power from another circuit for the operation of a passive RF ID tag. Alternatively, the IC may be designed to receive power from an energy source (e.g. battery) for the operation of an active RF ID tag. The functional block may be created from a host substrate and separated from this substrate. This method of making the functional block can be found in the method described in U.S. Pat. No. 6,291,896 which is entitled "Functionally Symmetric Integrated Circuit Die." Alternatively, the functional block can be the NanoBlock® IC's made by Alien Technology, Morgan Hill, Calif.

Figure 2A:
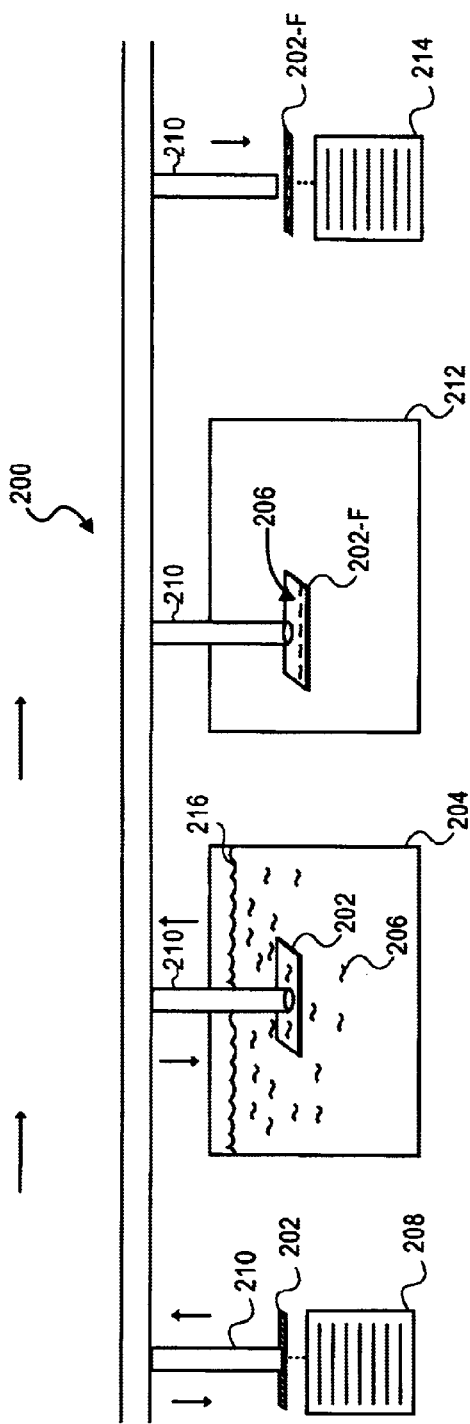
FIG. 2A illustrates a schematic diagram of an exemplary apparatus in which blocks are deposited into a relocating tool using FSA.

FIG. 2A illustrates an exemplary embodiment of the present invention in which functional blocks are deposited into a relocating tool. In FIG. 2A, a process line 200 includes a relocating tool 202, and a deposition device 204. The relocating tool 202 includes at least one receptor site (not shown) in the surface of the relocating tool 202 that is configured to receive a functional block 206. For example, if the functional blocks 206 are square shaped, the receptor sites are designed to be square shaped and slightly larger than the blocks to allow the blocks to closely fit within the receptor sites. In a preferred embodiment, the relocating tool 202 includes an array of receptor sites configured to receive an array of functional blocks. The array of receptor sites may have a pattern of the final arrangement of the functional blocks for an electronic assembly. For instance, the array of receptor sites may have a pattern of rows of display drivers for a flat panel display. The relocating tool 202 is designed such that it can include dense arrays of receptor sites, much denser than shown in this figure.

In one example, the process line 200 further includes a cartridge 208 which stores a set of relocating tools 202 having receptor sites that are empty. The process line 200 further includes a moving mechanism 210, such as a robotic arm assembly, for moving a relocating tool 202 from one device or one station to the next. Additionally, the process line 200 may also include a drying device which can be used to dry the relocating tool 202 having receptor sites filled with functional blocks 206 (relocating tool 202F). Further yet, the process line 200 may include another cartridge 214 which stores a set of relocating tools 202F having receptor sites filled with functional blocks 206.

Continuing with FIG. 2A, in another example, the deposition device 204 is a FSA device. FSA can be a conventional FSA device. In this example, a FSA fluid such as deionized water may be added to the FSA device. Functional blocks 206 are added to this fluid forming a slurry 216. The slurry 216 can be dispensed over the relocating tool 202 that has been moved to the FSA device. The functional blocks 206 are then deposited into the receptor sites in the surface of the relocating tool 202. Other devices known in the art can also be used to deposit the functional blocks 206 to the relocating tool 202.

An exemplary sequence of filling the relocating tool 202 can be as followed. The moving mechanism 210 picks up an unfilled relocating tool 202 from the relocating tool cartridge 208. The moving mechanism 210 moves the relocating tool 202 to the deposition devices 204 where the functional blocks 206 are deposited into the receptor sites in the surface of the relocating tool 202. The moving mechanism 210 then moves the relocating tool 202F (the relocating tool 202 filled with the functional blocks 206) to the drying device 212 for drying the relocating tool. The moving mechanism 210 then drops the dried relocating tool 202F into the relocating tool cartridge 214.

Figure 2B:
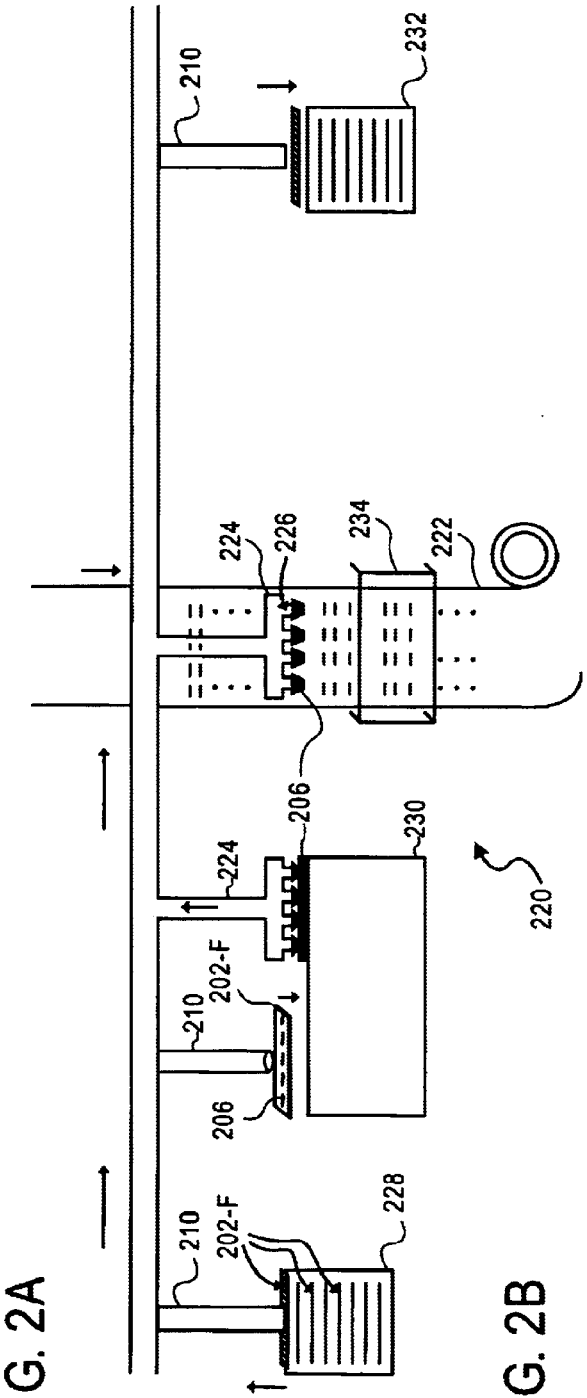
FIG. 2B illustrates a schematic diagram of an exemplary apparatus in which blocks are removed from a relocating tool filled with blocks and deposited into a substrate using a transfer tool.

FIG. 2B illustrates an exemplary embodiment of the present invention in which the functional blocks 206 from the relocating tool 202F are transferred to a substrate 222. In FIG. 2B, a process line 220 includes a transfer tool 224 which removes the functional blocks 206 from the relocating tool 202F and transfer the functional blocks to the substrate 222. The transfer tool 224 includes a plurality of nozzles 226 to which the functional blocks 206 attach during transferring. A vacuum source may be supplied to the plurality of nozzles 226 to securely hold the functional blocks 206 to the nozzles 226 during transferring.

In one example, the process line 220 also includes a cartridge 228 that stores the relocating tools 202F that are filled with the functional blocks 206. The cartridge 228 can be the same as the cartridge 214 above. The process line 220 can also be a continuation of the process line 200 discussed above such that the process line 220 and the process line 222 constitute one continuous process line. Alternatively, the process line 220 is separated from the process line 200. In this event, the vacuum source only needs to be connected to the process line 222 that has the transfer tool 224.

In another example, the process line 220 includes a staging station 230 where the relocating tool 202F are transferred from the moving mechanism 210 to the transfer tool 224. Here, the moving mechanism 210 picks up the relocating tool 202F from the relocating tool cartridge 228, and releases the relocating tool 202F on the staging station 230. The transfer tool 224 can then remove the functional blocks 206 from the relocating tool 202F. The moving mechanism 210 can also pick up the empty relocating tool 202 from the staging station 230 and moves the relocating tool 202 to a cartridge 232. In one example, the cartridge 232 is the same as the cartridge 208 in FIG. 2A.

Figure 2C:
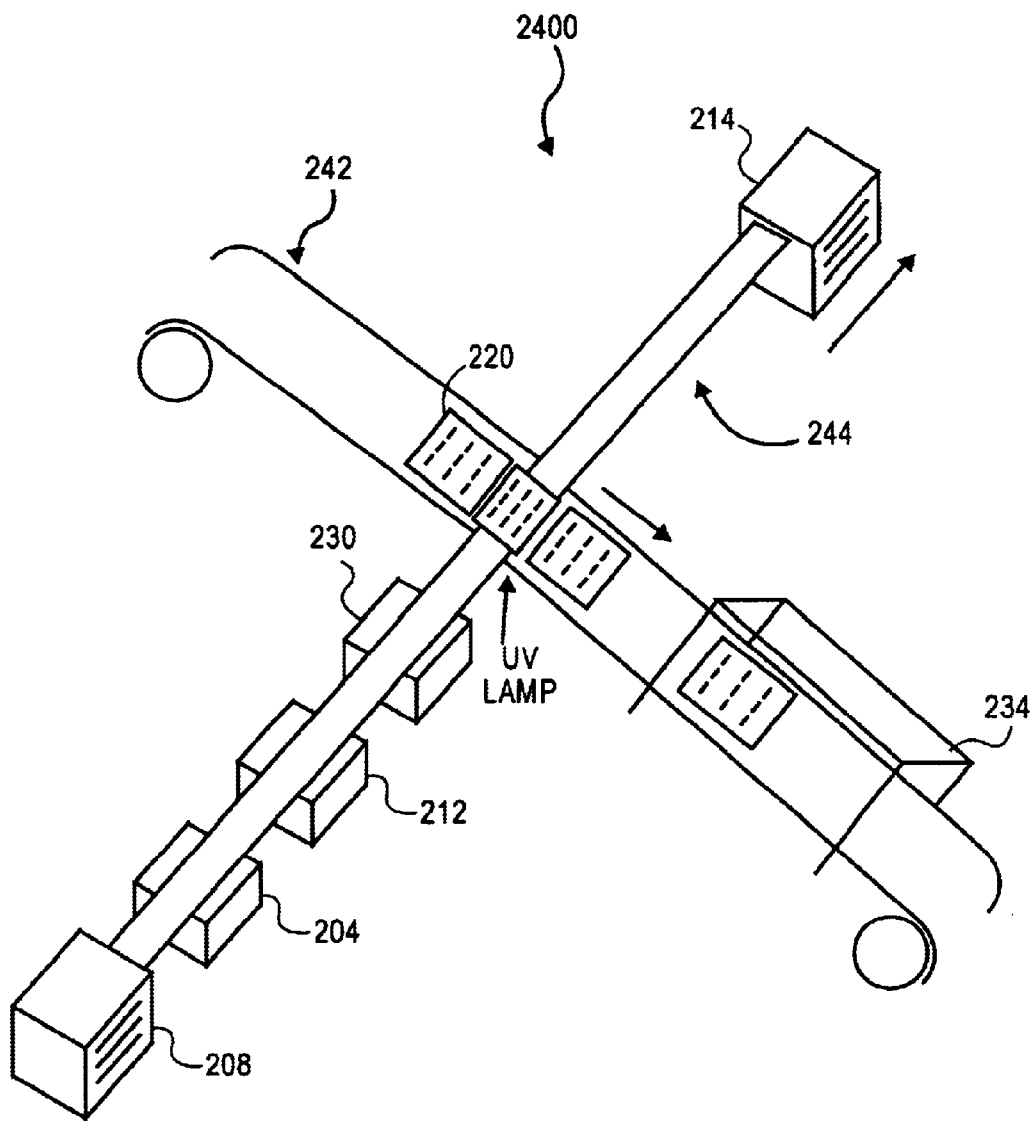
FIG. 2C illustrates a schematic diagram of an exemplary apparatus having a process line where blocks are deposited into a relocating tool using FSA as in FIG. 2A crossing over with another process line where blocks are removed from the relocating tool and deposited into a substrate as in FIG. 2B.

In yet another example, the process line includes a drying device 234 which dries or cures the substrate 220 using heat or UV lamp positioned below the substrate 220 as shown in FIG. 2C.

The substrate 220 can be made out of glass, plastic, foil, or any other suitable material depending on the application of the electronic assembly. The substrate 220 can be flexible, rigid, transparent, opaque, or any combination of the above. In one example, the substrate 220 is material that is conventionally used to make a flat panel display for a computer, a cellular phone, a digital camera, or a digital camcorder such as glass or plastic.

FIG. 2C further illustrates an exemplary sequence of filling the relocating tool with functional blocks and transferring the functional blocks to the substrate. In this sequence, the process line 2400 includes a relocating tool process line 242 and a substrate process line 244, crossing each other. The relocating tool process line 242 moves the relocating tool 202 from being empty to be filled with the functional blocks where the transfer tool then removes the functional blocks and deposit them to the substrate process line 244.

In an exemplary sequence, the moving mechanism 210 picks up an unfilled relocating tool 202 from the relocating tool cartridge 208. The moving mechanism 210 moves the relocating tool 202 to the deposition devices 204 where the functional blocks 206 are deposited into the receptor sites in the surface of the relocating tool 202. The moving mechanism 210 then moves the relocating tool 202F (the relocating tool 202 filled with the functional blocks 206) to the drying device 212 for drying the relocating tool. The moving mechanism 210 then moves the dried relocating tool 212F to the staging station 230. The transfer tool 224 then removes the functional blocks 206 from the relocating tool 202F. Vacuum suction may be applied at this point to secure the functional blocks 206 to the transfer tool 224. The transfer tool 224 moves to a predetermined point along the substrate 200 of a process line 234 and deposits the functional blocks to the substrates 220. In one example, the substrate 220 has a plurality of receptor sites that match the pattern of the nozzles 226 on the transfer tool 224. In this event, the transfer tool 224 moves to a predetermined point along the substrate 220 where the functional blocks 206 can be properly placed in the receptor sites.

Figure 3A:
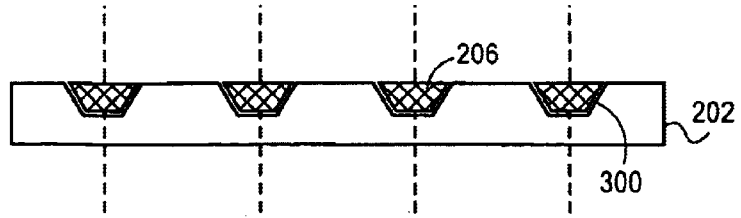
FIGS. 3A to 3C illustrate an example of receptor sites in a relocating tool being in alignment with nozzles in a transfer tool, which are also in alignment with receptor sites in a substrate.
Figure 3B:
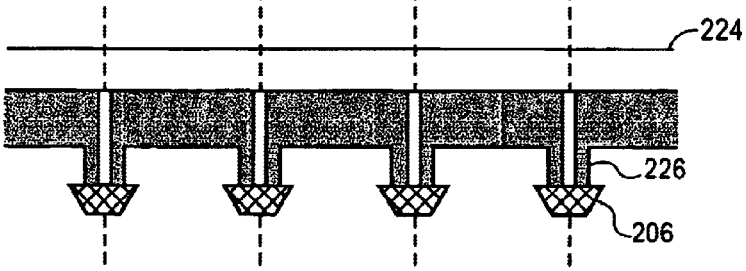
Figure 3C:
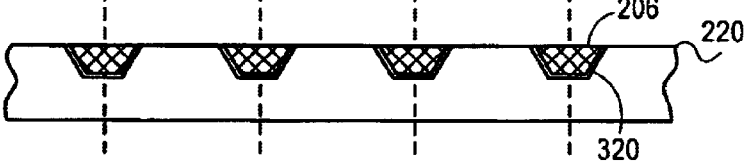

In one preferred embodiment, the nozzles of the transfer tool are in alignment with receptor sites in the surface of the relocating tool 202 and with the receptor sites in the substrate 220. FIGS. 3A to 3C illustrate that the nozzles 226 of the transfer tool 224 are in alignment with receptor sites 300 in the surface of the relocating tool 202 and with the receptor sites 320 in the substrate 220. With such alignment, the transfer tool 224 can accurately remove the functional blocks 206 from the receptor sites 300 in the relocating tool 202 and accurately place the functional blocks 206 into the receptor sites 320 in the substrate 220.

Figures 4A, 4B:
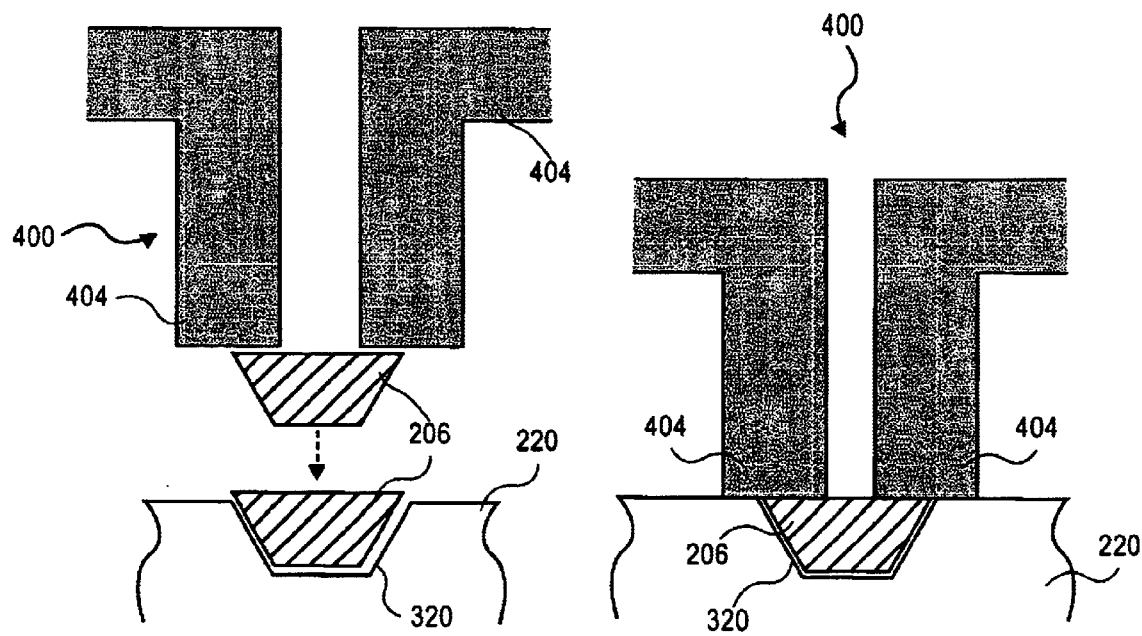
FIGS. 4A to 4B illustrate an enlarged side view of a transfer tool's nozzle having thick edges pressing down onto a substrate as a block is being deposited to a receptor site to place the block below or at the same plane with a surface of the substrate.

In another preferred embodiment, the nozzles of the transfer tool 224 include pressing edges 404. FIGS. 4A and 4B illustrate a nozzle 400 which could be the nozzle 226 discussed above. The nozzle 400 includes two pressing edges 404 on each side of the nozzle 400. The pressing edges 404 are particularly useful to planarize a functional block 206 into a receptor site 320 in a substrate 220. As shown in FIG. 4A, when the functional block 206 is dropped into the receptor site 320, the functional block 206 may be tilted, protruding out of the receptor site 320, or otherwise not completely deposited into the receptor site 320. Functional blocks not properly placed in the receptor sites are one of the reasons why a thick planarization layer may be necessary to ensure that a flat surface is present for formation of other components and interconnections upon the substrate 220. In most instances, the planarization layer is also the insulation layer in which contact vias are formed to allow interconnection to the functional blocks. When the functional blocks are not properly deposited or flatly deposited in the receptor sites, it is more difficult to create the vias.

As shown in FIG. 4B, the pressing edges 404 are used to press the functional block 206 into the receptor site 320 as the nozzle 400 is dropping or depositing the functional block 206 into the receptor site 320. Pressing down the functional block 206 secures the functional block 206 inside the receptor site 320 as well as planarizes the functional block 206 to the surface of the substrate 220. With the pressing edges 404 to ensure that the functional block 206 is properly deposited, the planarization layer for the substrate 220 may be thinner (e.g., 1 μm to 2 μm as compared to 10 μm with the blocks not completely and properly deposited). The planarization layer is thus flat and thin, which makes the via forming process (e.g., through conventional etching method) much easier to control. Additionally, higher yield can be achieved with nozzle 400.

In another preferred embodiment, one transfer tool may be adapted to transfer different sized and shaped functional blocks. FIGS. 5A to 5E illustrate that a transfer tool 500 having a plurality of nozzles 502 is used to transfer different sized and shaped functional blocks 504a to 544f. The nozzle 502 has a width $W_1$. The width $W_1$ is configured so that it can be used for various shaped and sized functional blocks 504a to 504f. The width $W_1$ is typically smaller than the smallest sized functional block, for example, the functional block 504c that the transfer tool 500 is designed to transfer. As shown in these figures, the transfer tool 500 is used to transfer functional blocks having trapezoidal shapes (e.g., 504a to 504d), rectangular shape (e.g., 504e), and cylindrical shape (e.g., 504f). Other shapes not shown can also be included. Additionally, the transfer tool 500 is used to transfer functional blocks of different sizes (e.g., 504a to 504d). The transfer tool 500 is particularly useful to transfer different sized and shape functional blocks at the same time and in one sequence for an electronic assembly that may require functional blocks of different sizes and shapes.

In another preferred embodiment, the relocating tool that is complementary to the transfer tool can be made with receptor sites of different sizes and shapes. In this embodiment, the functional block having the different sizes and shapes are deposited into the appropriate receptor sites in the relocating tools. The receptor sites on the relocating tool have complimentary shapes and sizes to the functional blocks' shapes and sizes. The transfer tool having the same size nozzles is then used to remove the different sized and shaped functional blocks from the relocating tool. The nozzles are spaced in such a way that the center of each of the nozzles is in alignment with the center of each functional block as shown in FIGS. 5A to 5F. The transfer tool then transfers the different sized and shaped functional blocks to the appropriate receptor sites on the substrate. The receptor sites on the substrate also are in alignment with the nozzles in the transfer tool.

FIG. 6 illustrates another embodiment of the present invention. FIG. 6 illustrates process line 600 in which adhesives are deposited into the plurality of receptor sites in the substrate. The process line 600 is similar to the process line 220 discussed in FIG. 2B above. Additionally, the process line 600 includes an adhesive dispenser 620, which meters a predetermined amount of adhesive 622 into each of receptor sites 630 in substrate 620. The presence of the adhesive 622 in the receptor site 630 secures the functional block 606 as it is deposited into the receptor site. The presence of the adhesive 622 thus prevents the functional block 606 from being misplaced or dislodged from the receptor site 630. In one example, the predetermined amount of adhesive 622 to be metered into the receptor sites 630 can be optimized to secure the functional blocks 620 within the receptor sites with no unnecessary protrusion of the blocks above the surface of the substrate 620.

The process line 600 includes transfer tool 624, which is similar to the transfer tool 224 discussed above. Furthermore, the transfer tool 624 may couple to a vibration source 628, such as a piezo actuator or an electrodynamic coil. The vibration source 628 agitates or vibrates the nozzles 626 as the functional blocks 606 are being dropped from the nozzles 626 to facilitate proper placement of the functional blocks 606 into the receptor sites 630. Additionally, the process line 600 includes a curing device 650 (e.g., UV lamp or heat lamp), which cures the substrate 620 having the functional blocks 606 deposited therein. The curing of the substrate 620 cures the adhesives 622 and thus, further securing the functional blocks 606 inside the receptor sites 630.

FIG. 7 illustrates another embodiment of the present invention. FIG. 7 illustrates process line 700 in which adhesives are deposited into the plurality of receptor sites and water droplets are dispensed over the receptor sites. The process line 700 is similar to the process lines 600 and 220 discussed in FIGS. 2B and 6 above. Similar to FIG. 6, the process line 700 includes an adhesive dispenser 720, which meters a predetermined amount of adhesive 722 into each of receptor sites 730 in substrate 720. The presence of the adhesive 722 in the receptor site 730 secures the functional block 706 as it is deposited into the receptor site. The presence of the adhesive 722 thus prevents the functional block 706 from being misplaced or dislodged from the receptor site 730.

In addition, the process line 700 includes a water dispenser 734, which meters a predetermined amount of water over the receptor sites 730. The substrate 720 can be coated with a hydrophobic layer (not shown) making the surface of the substrate (including the receptor sites) hydrophobic. The hydrophobic property in the substrate's surface makes the water droplets sit on top of the receptor sites 730 forming bubbles that can act like a mini-FSA system to move/direct the functional blocks in the receptor sites.

Transfer tool 724 is similar to the transfer tool 624 and 224 discussed above. The transfer tool 724 may be coupled to a vibration source 728. The vibration source 728 agitates or vibrates the nozzles 726 to facilitate proper placement of the functional blocks 706 into the receptor sites 730.

The process line 700 also includes a curing device 750 (e.g., UV lamp or heat lamp), which cures the substrate 720 having the functional blocks 606 deposited therein. The curing of the substrate 720 cures the adhesives 722 and dries the substrate 720, thus, further securing the functional blocks 706 inside the receptor sites 730.

Figure 8:
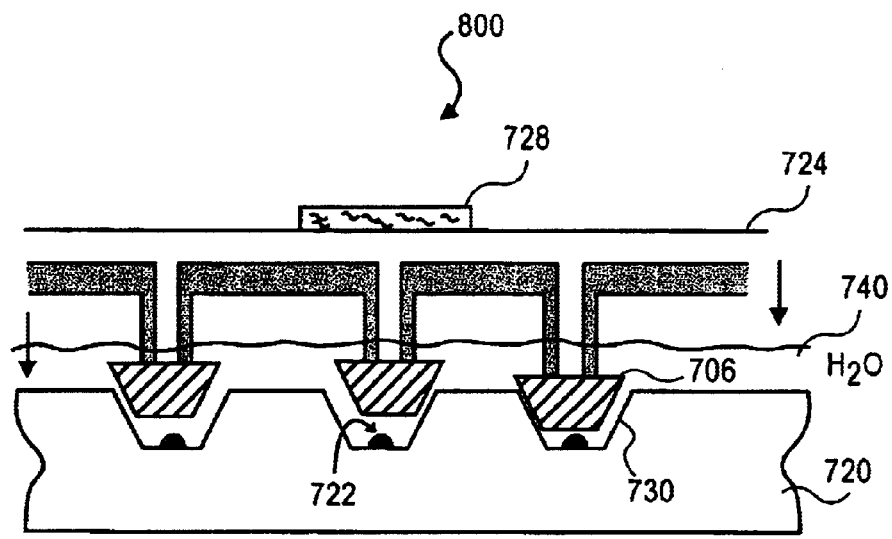
FIG. 8 illustrates a schematic diagram of an exemplary electronic assembly where adhesives are deposited into receptor sites of a substrate and the substrate is submerged in water before blocks are deposited into the substrate.

FIG. 8 illustrates an alternative embodiment 800 of the process line 700 shown in FIG. 7. Instead of dispensing water over the receptor sites 730, the substrate 720 is submerged in a water 740. The water 740 can be a shallow water bath into which the substrate 720 is submerged. When the substrate 720 is submerged, the receptor sites 730 are below the water level. In this embodiment, the water facilitates the movement of the functional blocks 706 into the receptor sites 730. The vibration from the vibration source 728 will also facilitate the movements of the functional blocks 706 over the receptor sites.

Figure 9:
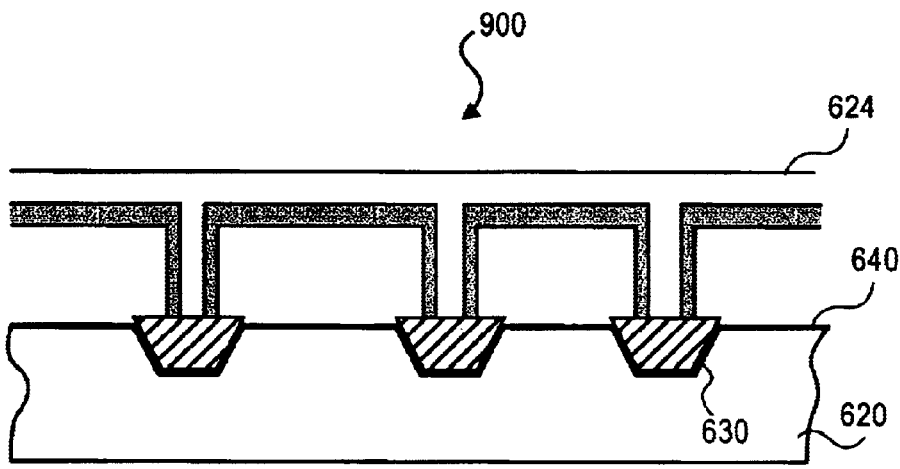
FIG. 9 illustrates a schematic diagram of an exemplary electronic assembly where a polymer adhesive film such as polyvinyl alcohol is deposited over a substrate before blocks are deposited into receptor sites of the substrate.

FIG. 9 illustrates an alternative embodiment 900 of the process line 600 shown in FIG. 6. In the embodiment 900, instead of using the adhesives 622 to help securing the functional blocks 630, the substrate 620 is coated with a layer 640 of an adhesive material that can be cured to bond to the functional blocks 606. An example of such a material is polyvinyl alcohol (PVA). When PVA is cured, the functional blocks deposited in the receptor sites 630 will be secured to the PVA layer, thus, secured within the receptor sites 630.

Figure 10:
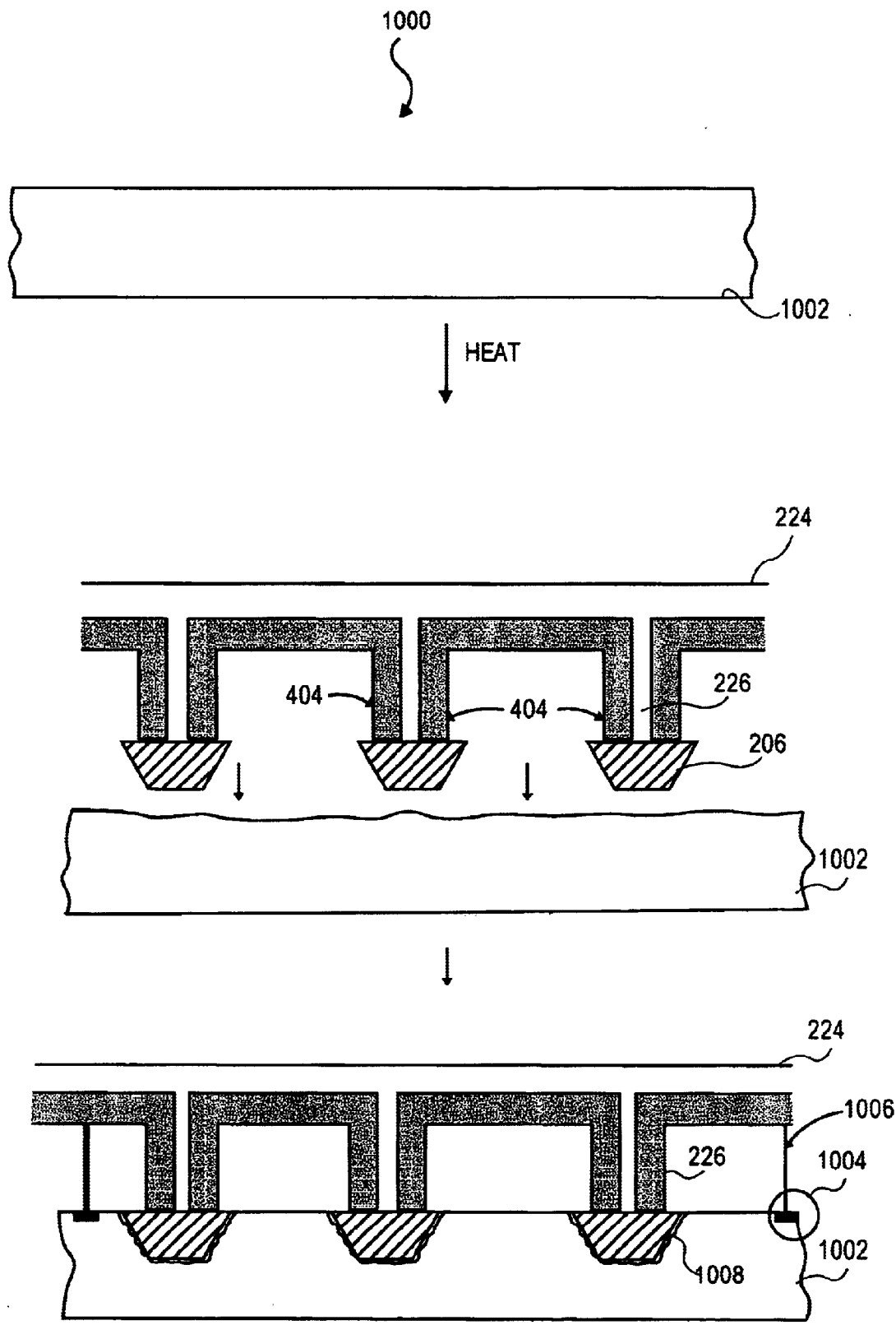
FIG. 10 illustrates a schematic diagram of exemplary electronic assembly where heat is used to heat a thermoset substrate or a thermoplastic substrate and blocks are pressed into the heated thermoset substrate or the heated thermoplastic substrate.

FIG. 10 illustrates another exemplary embodiment, embodiment 1000, of the present invention. In the embodiment 1000, a substrate that is made out of a thermoset material is used. Thermoset materials usually start out as liquids. Heating them causes them to cure into a solid. The thermoset substrate is first heated; functional blocks are then deposited to the thermoset substrate; then, the thermoset substrate is cured which when cured, will have the functional blocks deposited therein with receptor sites forming to conform to the blocks. It is possible to have a partially-cured (aka "beta staged") thermoset which is solid, but can be cured more. Examples of a thermoset material include polyisoprene, a beta staged thermoset, epoxy, and urethane polymer networks. Alternatively, the substrate is made out of a thermoplastic material that can be heated above its glass transition temperature such that the substrate is softened. Thermoplastic materials usually start out as solids, which get softened at high temperature, and then cooled to a solid again. The functional blocks are deposited into the heated and softened thermoplastic substrate which when cooled, will have the blocks deposited therein with receptor sites forming to conform to the blocks.

In both of these embodiments, the substrate 1002 does not include receptor sites that are already formed into the surface of the substrate. In one example, the embodiment 1000 includes a heater (not shown) that can heat the thermoset substrate 1002 to a temperature exceeding the thermo limit to soften the substrate 1002. In another example, the embodiment 1000 includes a heater (not shown) that can heat the thermoplastic substrate 1002 to a temperature exceeding the glass transition limit to soften the substrate 1002.

To deposit the functional blocks into the heated thermoset substrate 1002 or the thermoplastic substrate 1002, the process line 200 and the process line 220 discussed above can be used. Once the transfer tool 224 have the functional blocks 206 attached to the nozzles 226 using any one of the embodiments discussed above, the transfer tool 224 can press the functional blocks 206 into the heated and softened substrate 1002. In one example where the vacuum source is coupled to the transfer tool 224 to secure the functional blocks 206 to the nozzles 226, the vacuum needs to be released to release the functional blocks 206 from the nozzles 226.

In one example, the surface of the transfer tool 224 that contact the substrate 1002 is covered with or made out of a non-stick material. For example, the surface of the nozzles 226 and the pressing edges 404 on each side of the nozzles 226 are coated with a non-stick material such as fluoropolymer. The fluoropolymer coating will prevent the nozzles 226 and the pressing edges 404 from sticking to the substrate 1002 when the functional blocks 206 are being pressed into the substrate 1002.

In one embodiment, the substrate 1002 may include a couple of tags 1004 placed on the surface of the substrate 1002. The transfer tool 224 includes a coupled of stopping posts 1006. As the transfer tool 224 is depositing the functional blocks 206 into the substrate 1002, (e.g., by pressing the functional blocks 206 into the heated and softened substrate 1002), the stopping posts 1006 of the transfer tool 224 contact and register the tags 1004. When this contact occurs, the transfer tool 224 will stop pressing the nozzles and the blocks 206 further into the substrate 1002. The stopping posts 1006 and the tags 1004 are particularly useful to determine how deep the functional blocks 206 are to be pressed into the substrate 1002.

The embodiments discussed in relation to FIG. 10 enable the forming of receptor sites 1008 as the functional blocks 206 are being deposited. The functional blocks 206 are pressed into the heated and softened substrate. As the functional blocks 206 are pressed into the substrate, they create the receptor sites 1008 that are conforming to the shapes and sizes of the particular functional blocks 206. Some material of the substrate 1002 may be displaced as the blocks are being deposited. This displacement is nevertheless minimal. Creating the receptor sites 1008 as the functional blocks 206 are being deposited prevents the problem of the functional blocks not filling the receptor sites perfectly and thus, may eliminate the need for a planarization layer. Additionally, the substrate need not be supplied with receptor sites already formed therein. This allows for flexibility in using the same substrate to make electronic devices having different patters of functional blocks.

Figure 11:
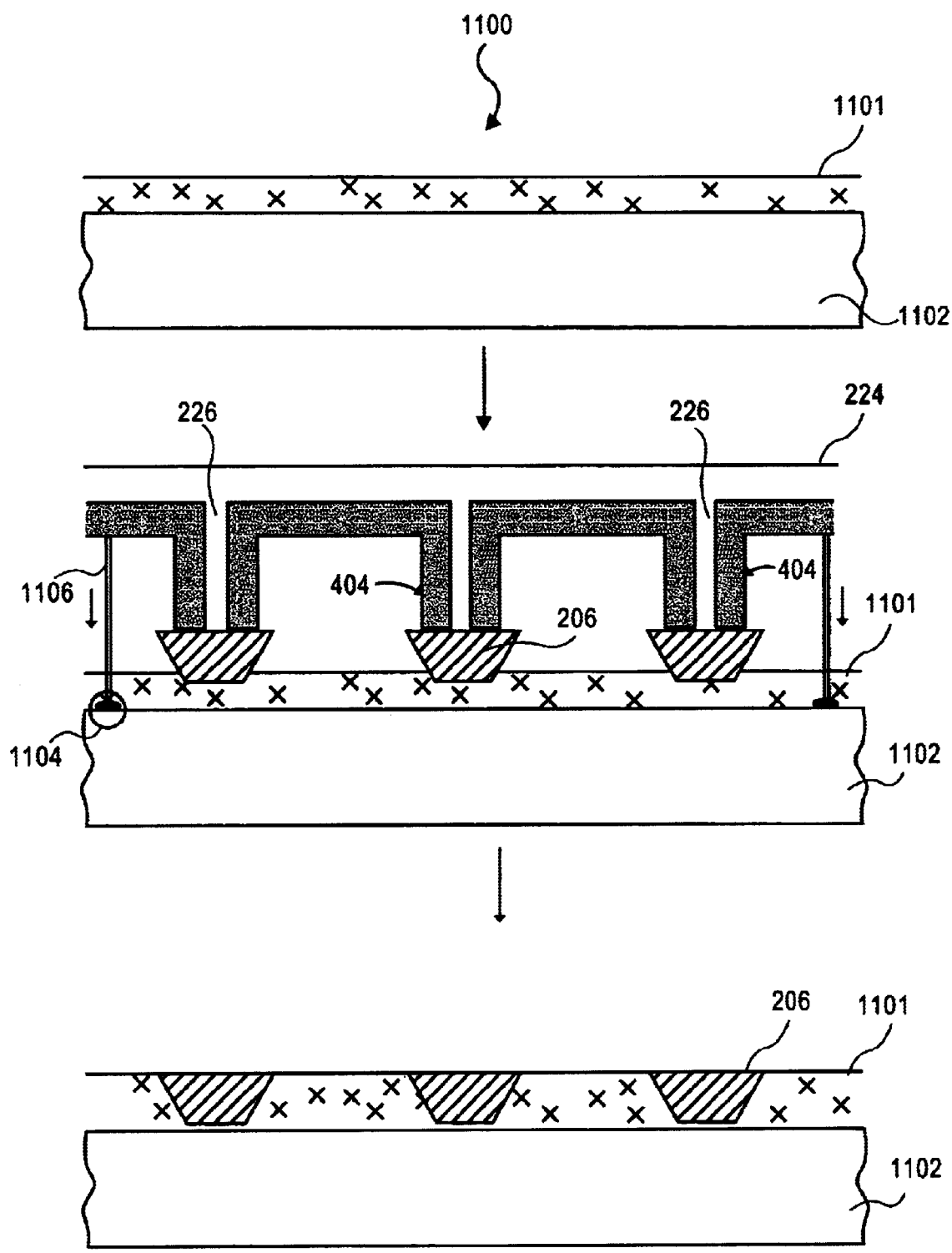
FIG. 11 illustrates a schematic diagram of an exemplary electronic assembly where curable adhesive film is deposited over a substrate and blocks are pressed into the curable adhesive film.

FIG. 11 illustrates another exemplary embodiment, embodiment 1100, of the present invention. In the embodiment 1100, a substrate 1102 is coated with a layer of curable adhesive 1101, for example, a layer of UV curable adhesive such as epoxy. Layer 1101 could also be an adhesive, such as a curable photoresist material or an anisotropic conductive material. The substrate 1102 does not include receptor sites that are already formed into the surface of the substrate.

To deposit the functional blocks 206 into the heated thermoset substrate 1102, the process line 200 and the process line 220 discussed above can be used. Once the transfer tool 224 have the functional blocks 206 attached to the nozzles 226 using the embodiments discussed above, the transfer tool 224 can press the functional blocks 206 into the UV curable adhesive layer 1101 on the substrate 1002. In one example where the vacuum source is coupled to the transfer tool 224 to secure the functional blocks 206 to the nozzles 226, the vacuum needs to be turned off to release the functional blocks 206 from the nozzles 226.

In one example, the surface of the transfer tool 224 that contact the substrate 1102 is covered with or made out of a non-stick material. For example, the surface of the nozzles 226 and the pressing edges 404 on each side of the nozzles 226 are coated with fluoropolymer. The fluoropolymer will prevent the nozzles 226 and the pressing edges 404 from sticking to the substrate 1102 when the functional blocks 206 are being pressed into the substrate 1102.

In another embodiment, the substrate 1102 may include a couple of tags 1104 placed on the surface of the substrate 1 102. The transfer tool 224 includes a couple of stopping posts 1006. As the transfer tool 224 is depositing the functional blocks 206 into the UV curable adhesive layer 1101 on the substrate 1102 substrate 1002, (e.g., by pressing the functional blocks 206 into the UV curable adhesive layer 1101), the stopping posts 1006 of the transfer tool 224 contact and register the tags 1004. When this contact occurs, the transfer tool 224 will stop pressing the nozzles and the blocks 206 further into the UV curable adhesive layer 1101 on the substrate 1102. The stopping posts 1006 and the tags 1004 are particularly useful to determine how deep the functional blocks 206 are to be pressed into the UV curable adhesive layer 1101 on the substrate 1102. It is preferred that the UV curable adhesive layer 1101 has a thickness that is similar to the thickness of the functional blocks 206.

In another example, the blocks 206 are deposited onto a functional adhesive film, which can then be attached to other substrate to make electronic devices. The blocks 206 thus need not be attached to the substrate until the needs arise. For instance, the blocks 206 are first deposited to the functional adhesive film using the transfer tool 224 that has the blocks 206 attached to it. When the transfer tool 224 is removed, the blocks 206 remain attached to the functional adhesive film. The functional adhesive film may be coupled to a carrier film or a release film (e.g., release paper), which may later on release the functional adhesive film when it is coupled to a substrate. The functional adhesive film can be an anisotropic conductive film or a photoresist film, or other type of film that performs a particular function for the electronic device. When ready, the functional adhesive film can then be affixed to a substrate such as the substrate 1102 which can be used to make various electronic devices, e.g., antennas and circuit boards. The functional adhesive film with the functional blocks 206 attached thereto can be prepared in roll form from which desirable sections can be cut to attach to various substrates. Similar to the examples shown in FIG. 11, these substrates do not include receptor sites to be created on the surfaces where the blocks can be deposited. Instead, the functional adhesive film functions to keep the blocks adhered to the substrates.

Figure 12A:
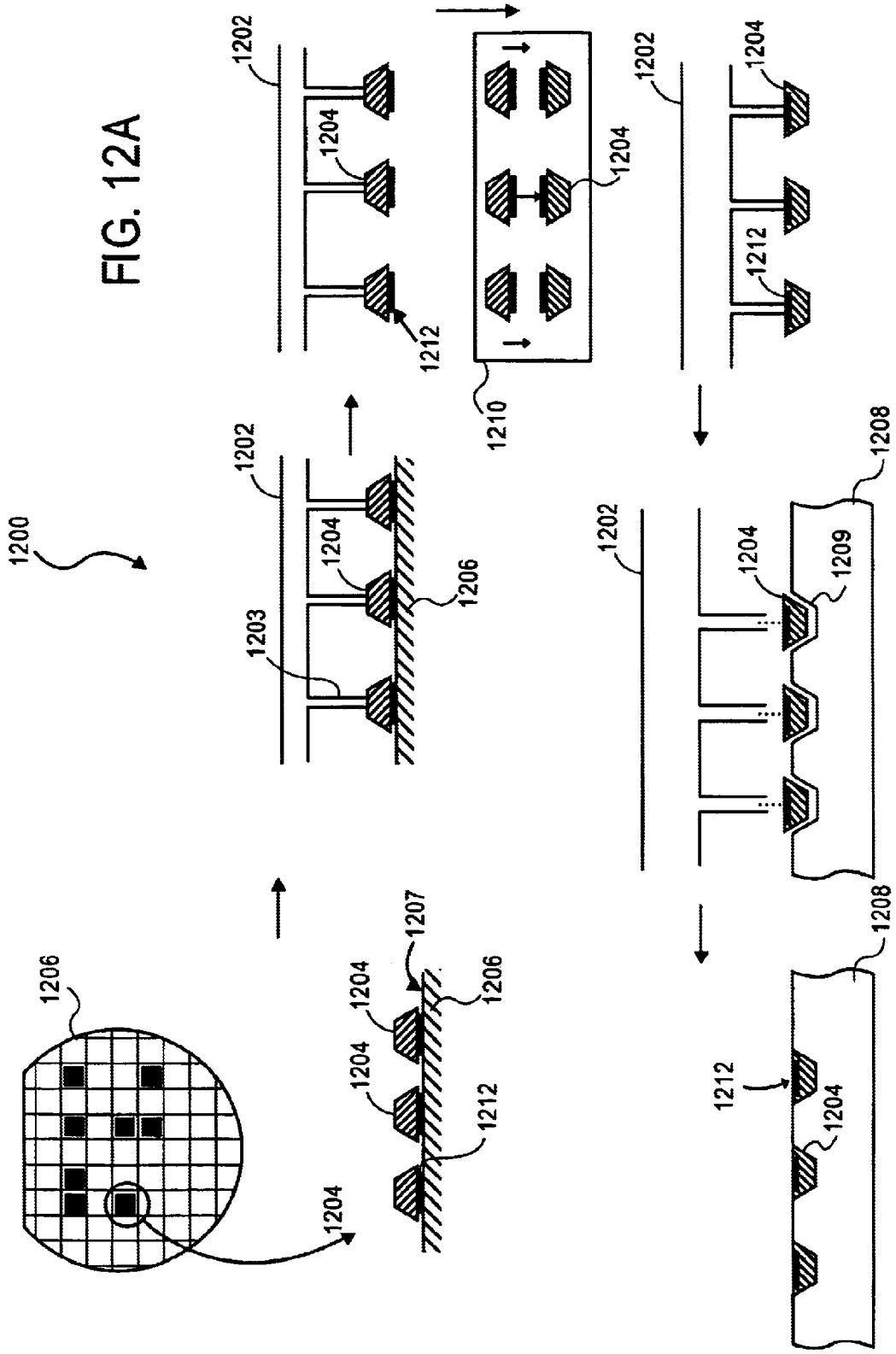
FIG. 12A illustrates a schematic diagram of an exemplary apparatus having a process line where a transfer tool transfers blocks formed on a first substrate to a second substrate.

FIG. 12A illustrates yet another embodiment of the present invention, embodiment 1200. The embodiment 1200 includes a transfer tool 1202 which is similar to the transfer tool 224 described in FIG. 2B. The transfer tool 1202 in the embodiment 1200 is used to transfer at least one functional block 1204 from one substrate 1206 to another substrate 1208.

In the embodiment 1200, the functional blocks 1204 are formed on the substrate 1206. In one example, the substrate 1206 is a semiconductor wafer typically used for making various electronic devices in the semiconductor field. Conventional methods used to form the functional blocks 1204 are well known in the art. In the embodiment 1200, the functional blocks are formed with the circuitry components 1212 facing the surface 1207 of the substrate 1206. Conventional etching methods are then used to form the shape of the functional blocks 1204, and in the example shown in FIG. 12A, the shape is trapezoidal. As mentioned above, the functional blocks 1204 can be of different shapes and sizes without deviating from the scope of the present invention.

Continuing with the embodiment 1200, the transfer tool 1202 having at least one nozzle 1203 couples to the functional block 1204 on the substrate 1206. The transfer tool 1202 removes the functional blocks 1204 from the substrate 1206. Conventional methods such as heating or solvents can be used to release the functional blocks 1204 from the substrate 1206. The transfer tool 1202 may be attached to a vacuum source to provide the necessary suction to the nozzle 1203 for the removal of the functional block 1204.

The transfer tool may have a set of nozzles 1203 having a pattern matching the pattern of how the functional blocks 1204 are to be placed onto the substrate 1208. In one example, the substrate 1208 includes a plurality of receptor sites 1209. In this example, the nozzles 1203 will have the pattern that is in alignment with the pattern of the receptor sites 1209 on the substrate 1208.

Note that when the transfer tool 1202 removes the functional blocks 1204 from the substrate 1206, the circuitry components 1212 formed on the functional blocks 1204 are facing away from the transfer tool 1202. The embodiment 1200 further includes a transfer station 1210. The functional blocks 1204 are dropped into the transfer station 1210 and there, the functional blocks 1204 are inverted. The transfer tool 1202 then picks up the inverted functional blocks 1204 and this time, the circuitry components 1212 are facing toward the transfer tool 1202. In one example, the embodiment 1200 includes another transfer tool which will pick up the inverted functional blocks 1204 are deposit the blocks 1204 to the substrate 1208.

Continuing with the embodiment 1200, the transfer tool 1202 deposits the functional blocks 1204 into the receptor sites 1209 in the substrate 1208. The vacuum pressure may need to be released in order for the transfer tool 1202 to drop the functional blocks 1204 into the receptor sites 1209. The nozzles 1203 may press down onto the substrate 1208 as discussed above to planarize and secure the function blocks 1204 in the receptor sites.

The embodiment 1200 can be used in conjunction with some of the embodiments discussed above, (e.g., FIGS. 6 to 11). For example, the substrate 1208 may include adhesives and water droplets to facilitate the deposition of the functional blocks into the substrate 1208. The substrate 1208 may also be submerged in water during the deposition process to facilitate the deposition of the functional blocks into the substrate 1208. Alternatively, the substrate 1208 may be made out of a thermoset or thermoplastic material so that it can be heated and the functional blocks 1204 can be pressed into the substrate 1208 as discussed above.

Figure 12B:
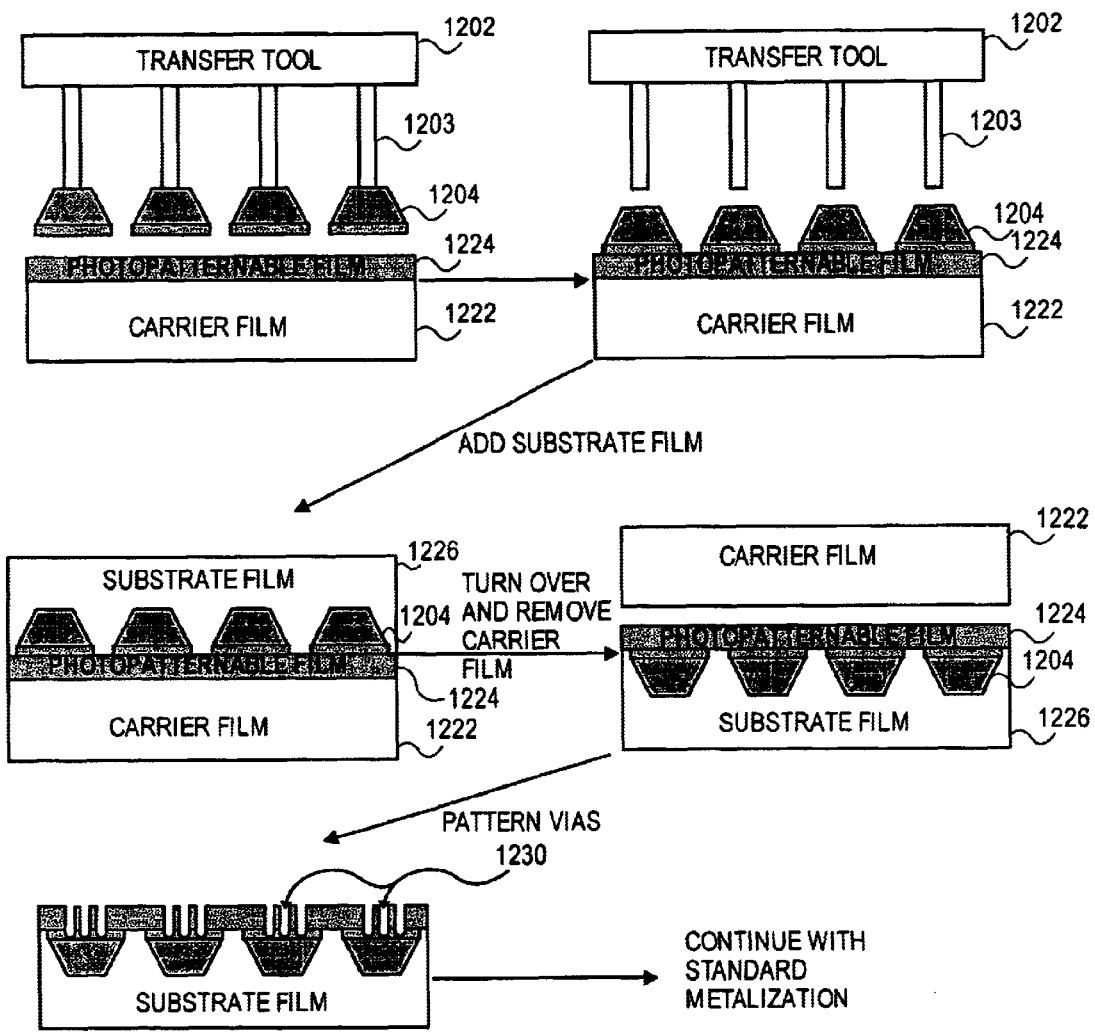
FIG. 12B illustrates a schematic diagram of an exemplary apparatus having a process line where a transfer tool transfers blocks formed on a first substrate to a carrier and a material is formed over the blocks that are deposited in the carrier to form a second substrate.

FIG. 12B illustrate another exemplary embodiment 1220 which is similar to the embodiment 1200 of FIG. 12A except with regard to the processes of depositing the functional blocks 1204 into the substrate. This figure shows that the transfer tool 1202 having at least one nozzle 1203 has removed the functional blocks 1204 from the substrate 1206 shown in FIG. 12A. In this embodiment, the transfer tool 1202 places or attaches the functional blocks 1204 onto a carrier 1222. The carrier 1222 includes a functional layer 1224 deposited thereon. Both the carrier 1222 and the functional layer 1224 include no receptor sites such as the receptor sites 1209 in the substrate 1208 of FIG. 12A. Also, note that the functional blocks 1204 have not been inverted at this point in the process. The functional blocks 1204 are placed or attached to the functional layer 1224 with the circuit side being in immediate contact with the functional layer 1224. The functional layer may function as a photo-patternable film or an anisotropic conductive-film typically used in making electronic devices.

Continuing with FIG. 12B, a material that is typically used for a substrate such as for a display substrate can be used to form the substrate layer 1226 is deposited over the functional blocks 1204 that are now attached to the functional layer 1224. The substrate layer 1226 that is deposited over the functional blocks 1204 is then turned over or flipped over. The carrier 1222 is removed exposing the surface of the functional layer 1224 that does not have the functional blocks 1204 attached thereto. In the case where the functional layer 1224 is a photopatternable film, contact vias 1230 are then created in the photopatternable film 1224 from the surface of the photopatternable film 1224 that does not have the functional blocks 1204 attached thereto using conventional methods to enable electrical interconnections to the functional blocks 1204 using conventional methods such as lithography and developing. Once the vias 1230 are created conventional metalization can be done to the functional blocks 1204. In the case where the functional layer 1224 is an anisotropic conducting film, electrical contacts to the functional blocks 1204 may be established through the functional layer 1224.

FIGS. 12C(1)–(5) illustrates yet another exemplary apparatus used to transfer the functional blocks 1204. This apparatus uses a transfer toot 1250 having an adhesive layer 1251 attached to one end as illustrated in FIG. 12C(1). The transfer tool 1250 is similar to the transfer tools described above in most aspects except that there are no nozzles such as nozzles 1203 included. The transfer tool 1250 may include a vacuum source such that facilitates in holding the adhesive layer 1251 to the transfer tool 1250 during transferring process. This vacuum source is similar to the vacuum source used in the transfer tool 1203 described above to adhere the functional blocks 1204 to the nozzle 1203. In one example, the transfer tool 1250 picks up the functional blocks 1204 as the transfer tool moves toward the functional blocks 1204 allowing the adhesive layer 1251 to pick up the functional blocks (see FIGS. 12C(1)–(2)). As shown in this figure, the functional blocks 1204 are deposited into a relocating tool 1252 that has receptor sites created to receive the functional blocks 1204 as discussed above and using the methods discussed above. The transfer tool 1250 lifts the functional blocks 1204 off the relocating tool 1252 as it moves away from the relocating tool 1252 with the functional blocks 1204 adhered to the adhesive layer 1251 as shown in FIG. 12C(3). At FIG. 12C(4), the transfer tool 1250 deposits or transfers the functional blocks 1204 to a substrate 1253. In one example, the substrate 1253 is similar to the substrate 1002 and 1102 as described in FIG. 10 and FIG. 11, respectively. The substrate 1253 can be a thermoset material that can be heated, a UV curable material, or a thermoplastic material. In such event, the substrate 1253 needs not have any receptor site formed in the substrate to receive the functional blocks 1204 similar to the embodiments discussed in FIG. 10 and FIG. 11. Further, the functional blocks 1204 need not be encapsulated as shown in FIG. 12C(5) and adhesive layer 1251 may function as both adhesive layer 1251 and the substrate 1253. Once the functional blocks 1204 are deposited into or onto the substrate 1253, the transfer tool 1250 releases the vacuum and leaving the adhesive layer 1251 on top of the substrate 1253 and the functional blocks 1204 deposited within the substrate 1253 as shown in FIG. 12C(5). This final structure can be used to make electronic devices wherein vias (not shown) can be created in the adhesive layer to enable electrical contact to the functional blocks 1204. In one example, the adhesive layer is made out of an anisotropic conducting film. In such case, electrical contact can be established to the functional blocks 1204 through the adhesive layer 1251.

Alternately, the transfer tool 1250 may be in the form of two continuous laminating machines with a way of pulling the relocating tool 1252 away from the adhesive layer 1251 located between the two continuous laminating machines. The adhesive layer 125 I and the substrate 1253 can be in the form of long webs. In a web based roll-to-roll process the first continuous laminating machine of the transfer tool 1250 laminates the adhesive layer 1251 onto the functional blocks 1204 and then the relocating tool 1252 is pulled away from the adhesive layer 1251 while leaving the functional blocks 1204 attached to the adhesive layer 1251. The second continuous laminating machine of the transfer tool 1250 then laminates the adhesive layer 1251 with the attached functional blocks 1204 onto the substrate 1253.

Although not shown, the substrate 1253 can have a plurality of receptor sites configured to receive the functional blocks 1204. In that case, the receptor sites would be in alignment with the functional blocks 1204 such that the functional blocks can be properly deposited into the receptor sites. The embodiments discussed in FIGS. 2B, 2C, 6, 7, and 8–11 can be used in conjunction with the transfer tool 1250 to deposit the functional blocks into the substrate 1253.

FIG. 13 illustrates an exemplary method 1300 of depositing functional blocks into a substrate according to some of the embodiments of the present invention. At operation 1302, the functional blocks are deposited into a relocating tool that has receptor sites configured to receive the functional blocks. In one example, FSA is used to deposit the functional blocks into the receptor sites in the relocating tool. At operation 1304, the relocating tool having the functional blocks deposited therein can be dried if necessary. At operation 1306, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 1308, the transfer tool is moved over to a substrate having receptor sites, also configured to receive the functional blocks. These receptor sites are also in alignment with the nozzles on the transfer tool. At operation 1310, after the transfer tool is properly registered over substrate, the transfer tool release the functional blocks into the receptor sites with the transfer tool optionally being vibrated. A vacuum suction may have been used to secure the functional blocks to the nozzles. In such event, to release the functional blocks, the vacuum is turned off. At operation 1312, the substrate having the functional blocks properly deposited can be dried or cured using, for example, a UV lamp.

FIG. 14 illustrates an exemplary method 1400 of depositing functional blocks into a substrate with the use of adhesive to secure the functional blocks according to some of the embodiments of the present invention. At operation 1402, the functional blocks are deposited into a relocating tool that has receptor sites configured to receive the functional blocks. In one example, FSA is used to deposit the functional blocks into the receptor sites in the relocating tool. At operation 1404, the relocating tool having the functional blocks deposited therein can be dried if necessary. At operation 1406, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 1407, an adhesives dispenser is used to meter adhesives into receptor sites in a substrate. At operation 1408, the transfer tool is moved over to a substrate having receptor sites configured to receive the functional blocks wherein the receptor sites contain adhesives. These receptor sites are also in alignment with the nozzles on the transfer tool. At operation 1410, after the transfer tool is properly registered over substrate, the transfer tool release the functional blocks into the receptor sites with the transfer tool optionally being vibrated. A vacuum source may have been used to secure the functional blocks to the nozzles. In such event, to release the functional blocks, the vacuum source is turned off. At operation 1412, the substrate having the functional blocks properly deposited can be dried or cured using, for example, a UV lamp.

Figure 15:
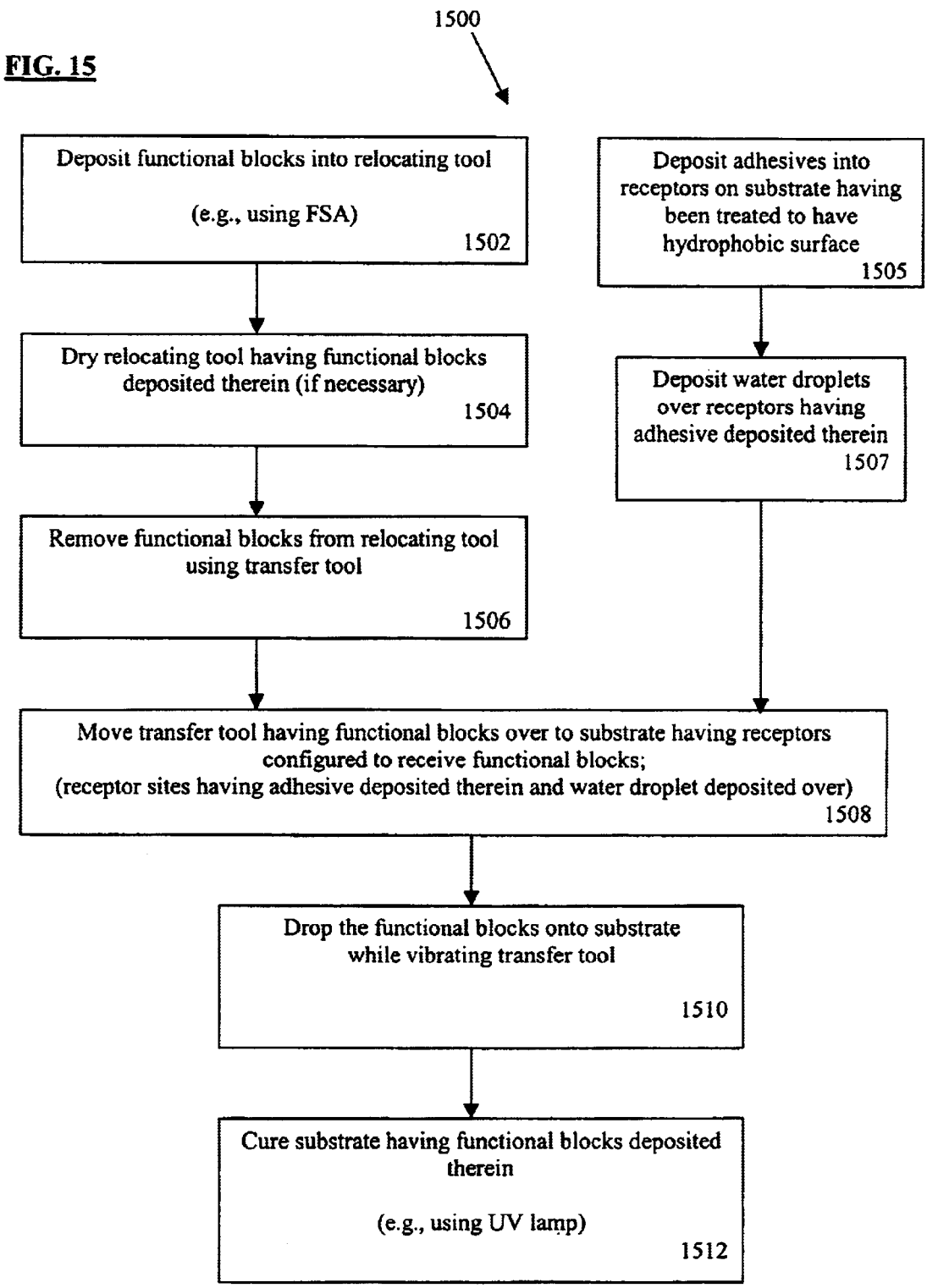
FIG. 15 illustrates an exemplary method of using a transfer tool and water droplets deposition to facilitate deposition of blocks into a substrate wherein receptor sites in the substrate have adhesives deposited therein.

FIG. 15 illustrates an exemplary method 1500 of depositing functional blocks into a substrate according to some of the embodiments of the present invention. The substrate includes adhesive to help secure the blocks to the substrate. The method 1500 uses water droplets to help move or direct the blocks to the receptor sites. At operation 1502, the functional blocks are deposited into a relocating tool that has receptor sites configured to receive the functional blocks. In one example, FSA is used to deposit the functional blocks into the receptor sites in the relocating tool. At operation 1504, the relocating tool having the functional blocks deposited therein can be dried if necessary. At operation 1506, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 1505, an adhesives dispenser is used to meter adhesives into receptor sites in a substrate. At operation 1507, a water dispenser dispenses water droplets over the receptor sites in the substrate. The substrate is treated so that it is hydrophobic. In this way, the water droplet will sit over the receptor sites acting as a mini-FSA environment for the functional blocks.

At operation 1508, the transfer tool is moved over to a substrate having receptor sites configured to receive the functional blocks wherein the receptor sites contain the adhesives and the water droplets. These receptor sites are also in alignment with the nozzles on the transfer tool. At operation 1510, after the transfer tool is properly registered over substrate, the transfer tool release the functional blocks into the receptor sites with the transfer tool optionally being vibrated. A vacuum suction may have been used to secure the functional blocks to the nozzles. In such event, to release the functional blocks, the vacuum is turned off. At operation 1512, the substrate having the functional blocks properly deposited can be dried or cured using, for example, a UV lamp.

Figure 16:
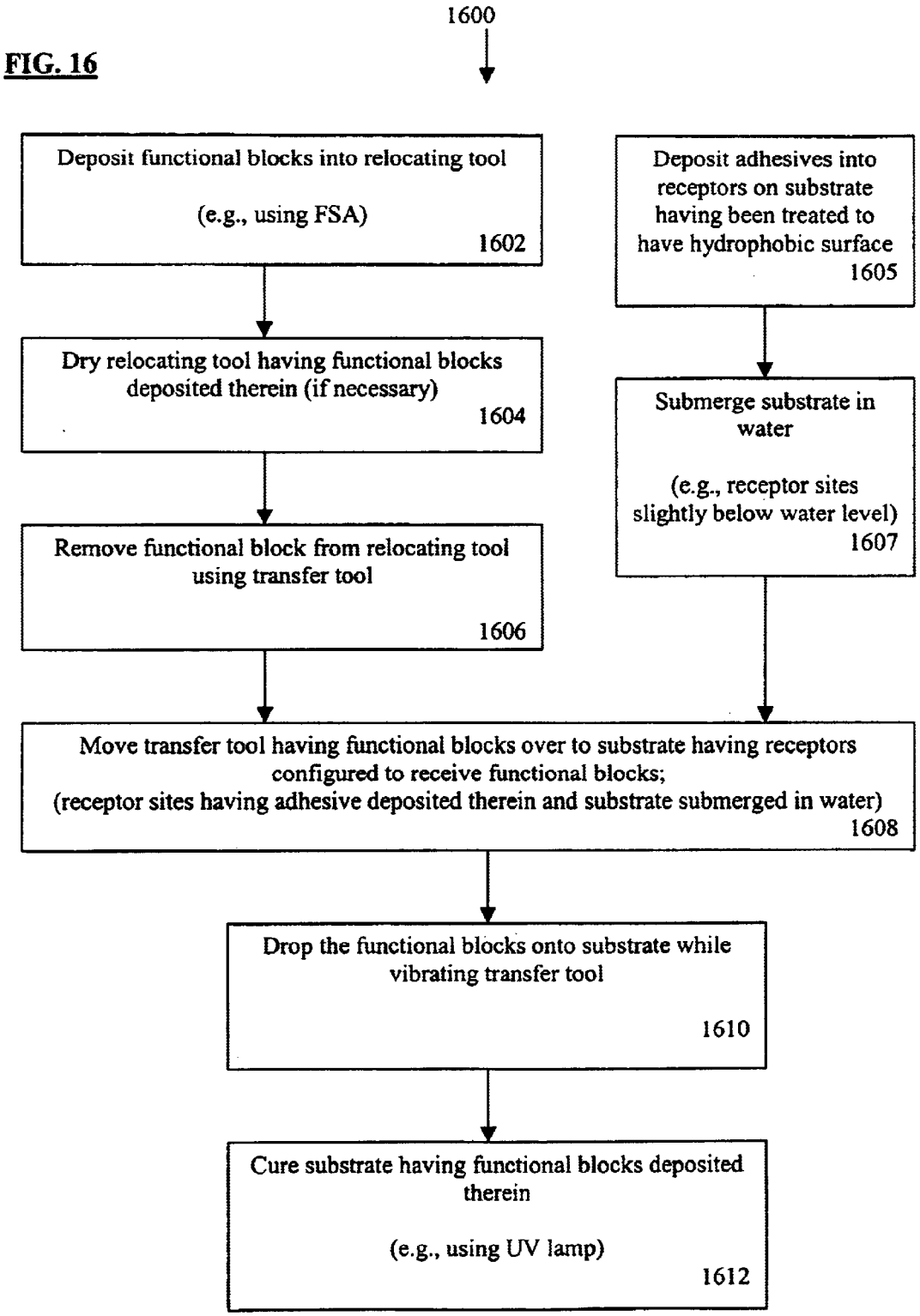
FIG. 16 illustrates an exemplary method of submerging a substrate in water and using a transfer tool to facilitate deposition of blocks into the substrate wherein receptor sites in the substrate have adhesives deposited therein.

FIG. 16 illustrates an exemplary method 1600 of depositing functional blocks into a substrate according to some of the embodiments of the present invention. The substrate includes adhesive to help secure the blocks to the substrate. The method 1500 uses water droplets to help move or direct the blocks to the receptor sites. At operation 1602, the functional blocks are deposited into a relocating tool that has receptor sites configured to receive the functional blocks. In one example, FSA is used to deposit the functional blocks into the receptor sites in the relocating tool. At operation 1604, the relocating tool having the functional blocks deposited therein can be dried if necessary. At operation 1606, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 1605, an adhesives dispenser is used to meter adhesives into receptor sites in a substrate. At operation 1607, the substrate is submerged in water such that the receptor sites are slightly below the water level. At operation 1608, the transfer tool is moved over to a substrate having receptor sites configured to receive the functional blocks wherein the receptor sites contain the adhesives and submerged under water. These receptor sites are also in alignment with the nozzles on the-transfer tool. At operation 1610, after the transfer tool is properly registered over substrate, the transfer tool release the functional blocks into the receptor sites with the transfer tool optionally being vibrated. A vacuum suction may have been used to secure the functional blocks to the nozzles. In such event, to release the functional blocks, the vacuum is turned off. At operation 1612, the substrate having the functional blocks properly deposited can be dried or cured using, for example, a UV lamp.

Figure 17:
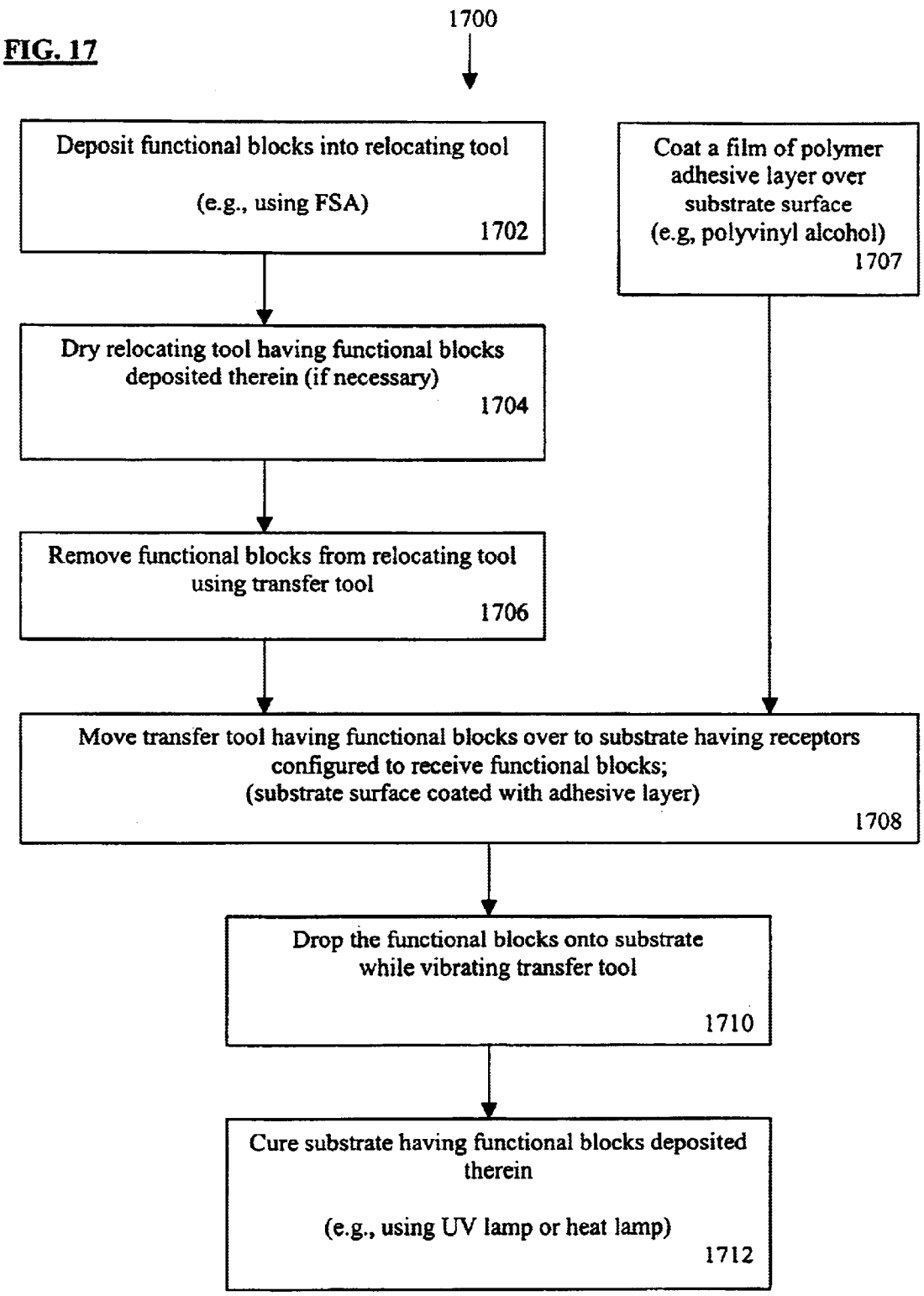
FIG. 17 illustrates an exemplary method of using a transfer tool to facilitate deposition of blocks into a substrate having a polymer adhesive film coated thereon.

FIG. 17 illustrates an exemplary method 1700 of depositing functional blocks into a substrate according to some of the embodiments of the present invention. The substrate includes a curable adhesive to help secure the blocks to the receptor sites. At operation 1702, the functional blocks are deposited into a relocating tool that has receptor sites configured to receive the functional blocks. In one example, FSA is used to deposit the functional blocks into the receptor sites in the relocating tool. At operation 1704, the relocating tool having the functional blocks deposited therein can be dried if necessary. At operation 1706, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 1707, a film of polymer adhesive such as polyvinyl alcohol is coated over the surface of the substrate including the receptor sites. Other curable adhesive can be used instead of the polyvinyl alcohol, such as polyisoprene-based adhesives, or other organic or polymeric adhesives. At operation 1708, the transfer tool is moved over to a substrate having receptor sites configured to receive the functional blocks wherein the receptor sites contain polyvinyl alcohol. These receptor sites are also in alignment with the nozzles on the transfer tool. At operation 1710, after the transfer tool is properly registered over substrate, the transfer tool release the functional blocks into the receptor sites with the transfer tool optionally being vibrated. A vacuum suction may have been used to secure the functional blocks to the nozzles. In such event, to release the functional blocks, the vacuum is turned off. At operation 1712, the substrate having the functional blocks properly deposited can be dried or cured using, for example, a UV lamp.

Figure 18:
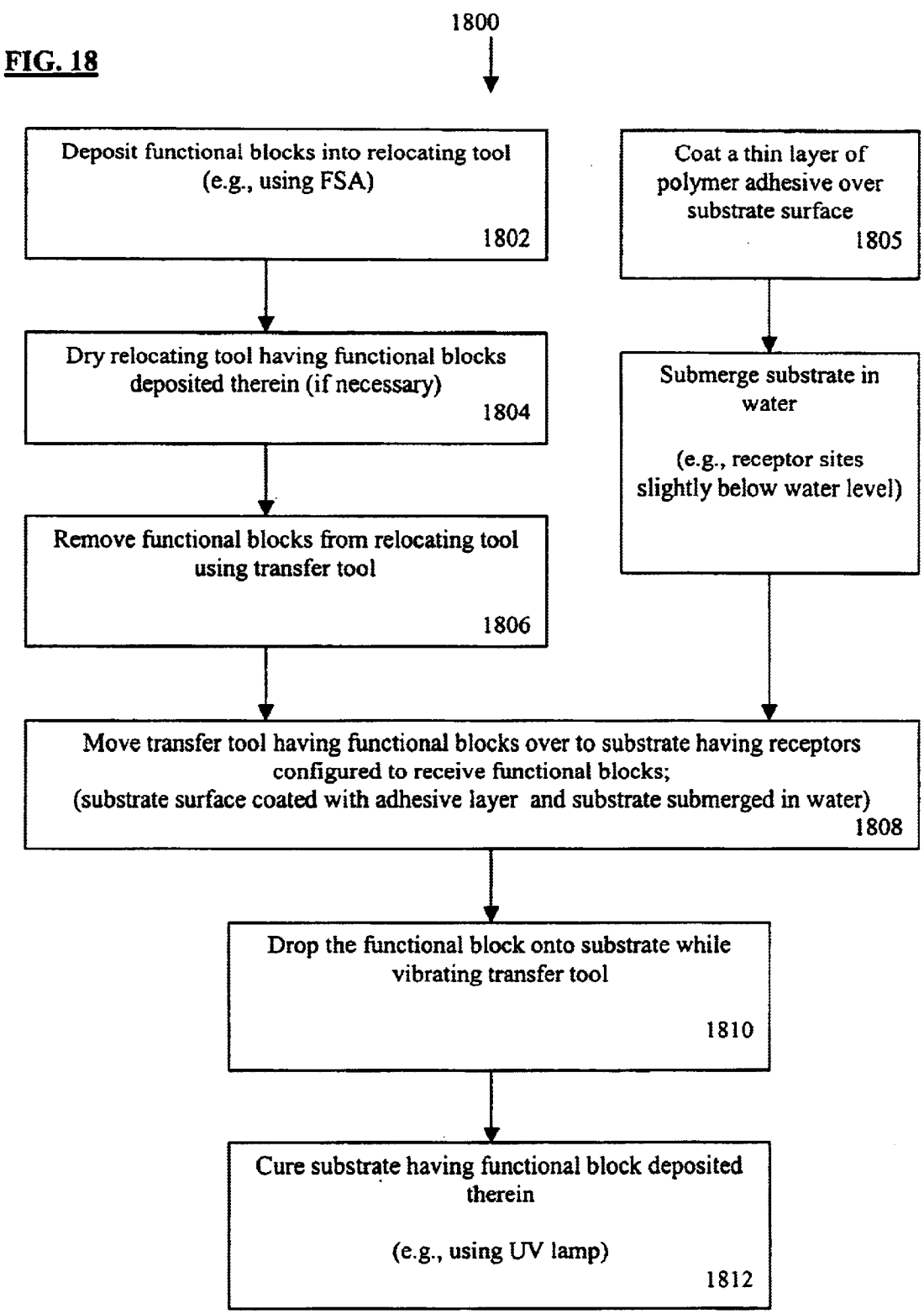
FIG. 18 illustrates an exemplary method of submerging a substrate in water and using a transfer tool to facilitate deposition of blocks into the substrate having a polymer adhesive film coated thereon.

FIG. 18 illustrates an exemplary method 1800 of depositing functional blocks into a substrate according to some of the embodiments of the present invention. The substrate includes a curable adhesive to help secure the blocks to the receptor sites. The substrate includes adhesive to help secure the blocks to the substrate. The method 1500 uses water droplets to help move or direct the blocks to the receptor sites. At operation 1802, the functional blocks are deposited into a relocating tool that has receptor sites configured to receive the functional blocks. In one example, FSA is used to deposit the functional blocks into the receptor sites in the relocating tool. At operation 1804, the relocating tool having the functional blocks deposited therein can be dried if necessary. At operation 1806, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 1805, a film of polyvinyl alcohol is coated over the surface of the substrate including the receptor sites. Other curable adhesive can be used instead of the polyvinyl alcohol. At operation 1807, the substrate is submerged in water such that the receptor sites are slightly below the water level. At operation 1808, the transfer tool is moved over to a substrate having receptor sites configured to receive the functional blocks wherein the receptor sites contain the polyvinyl alcohol and submerged under water. These receptor sites are also in alignment with the nozzles on the transfer tool. At operation 1810, after the transfer tool is properly registered over substrate, the transfer tool release the functional blocks into the receptor sites with the transfer tool optionally being vibrated. A vacuum suction may have been used to secure the functional blocks to the nozzles. In such event, to release the functional blocks, the vacuum is turned off. At operation 1812, the substrate having the functional blocks properly deposited can be dried or cured using, for example, a UV lamp.

Figure 19:
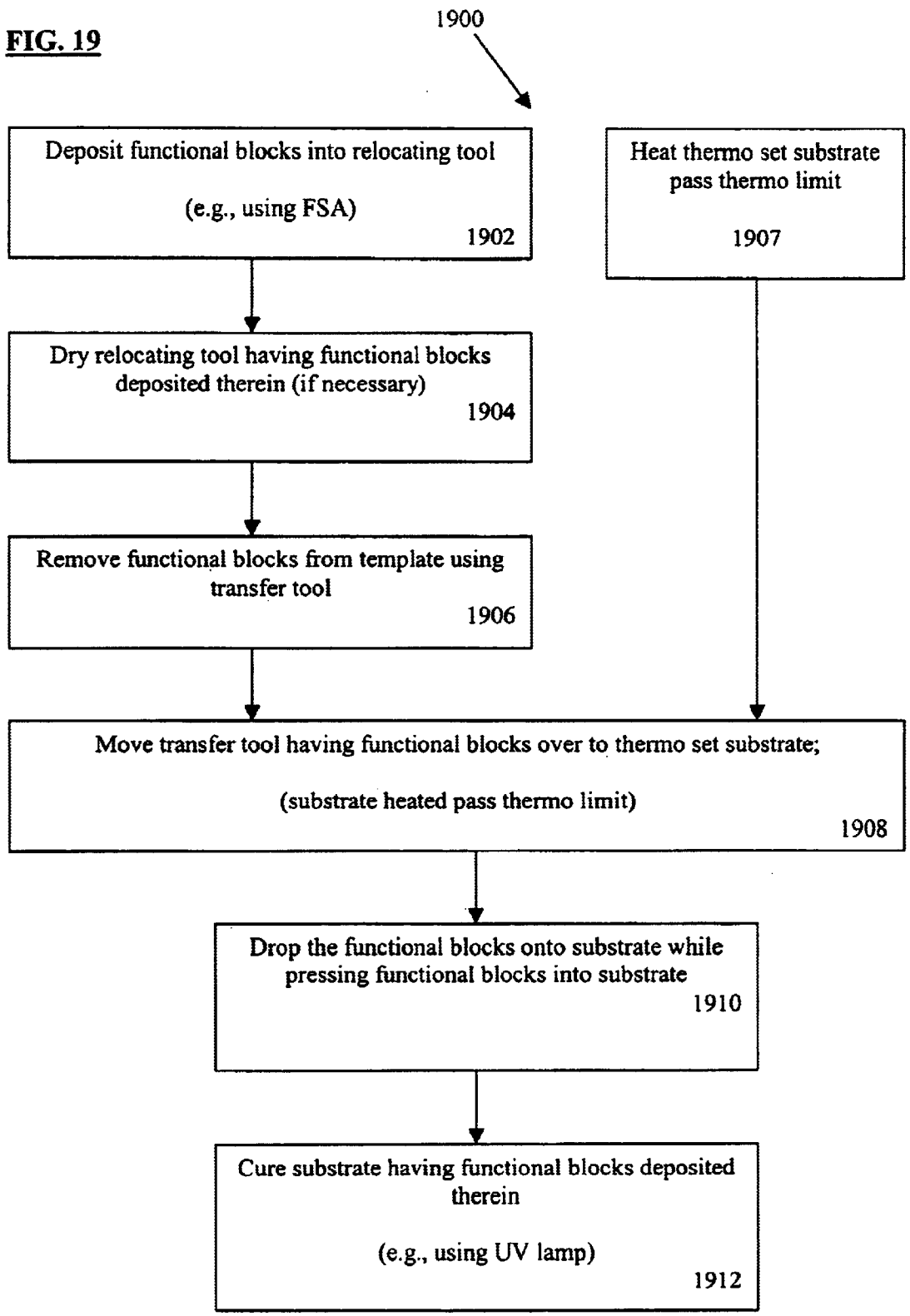
FIG. 19 illustrates an exemplary method of using a transfer tool to facilitate deposition of blocks into a thermoset substrate wherein the thermoset substrate is heated.

FIG. 19 illustrates an exemplary method 1900 of depositing functional blocks into a thermoset substrate according to some of the embodiments of the present invention. At operation 1902, the functional blocks are deposited into a relocating tool that has receptor sites configured to receive the functional blocks. In one example, FSA is used to deposit the functional blocks into the receptor sites in the relocating tool. At operation 1904, the relocating tool having the functional blocks deposited therein can be dried if necessary. At operation 1906, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 1907, the thermoset substrate is heated pass the substrate's thermo limit. The heating of the substrate makes the substrate soft so that the functional blocks can be pressed into the substrate. At operation 1908, the transfer tool is moved over to a substrate. The substrate in this embodiment does not contain any receptor site. At operation 1910, the transfer tool releases the functional blocks into the receptor sites while pressing down on the nozzles to press the functional blocks into the heated substrate. As mentioned above, the transfer tool has non-stick surface (e.g., surface coated with fluoropolymer) so that the pressing of the functional blocks into the substrate does not make the nozzles or other part of the transfer tool sticks to the substrate. A vacuum suction may have been used to secure the functional blocks to the nozzles. In such event, to release the functional blocks, the vacuum is turned off. At operation 1912, the substrate having the functional blocks deposited therein can be dried or cured using, for example, a UV lamp. The curing and drying secure the functional blocks in the substrate.

Figure 20:
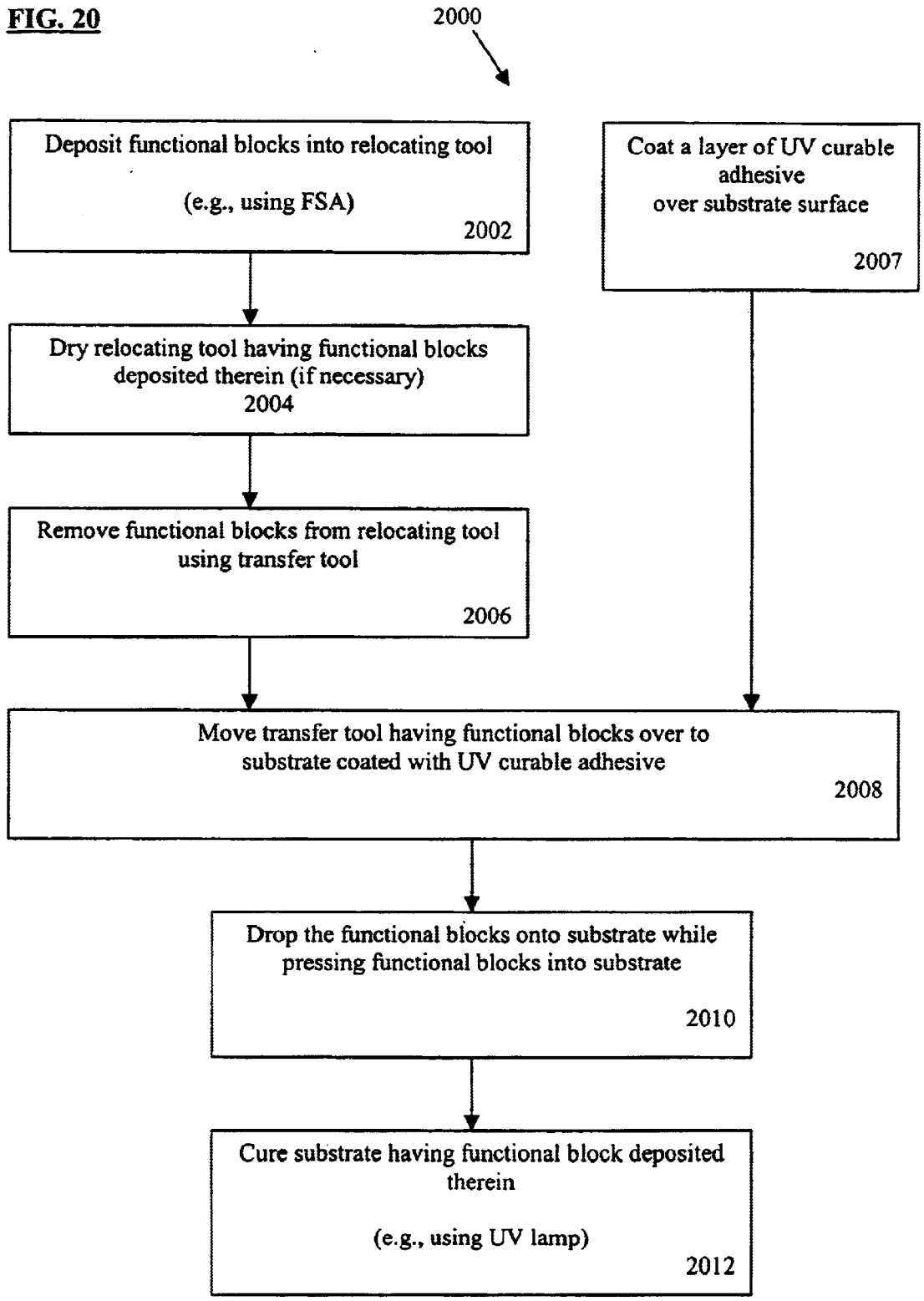
FIG. 20 illustrates an exemplary method of using a transfer tool to facilitate deposition of blocks into a curable adhesive layer deposited on top of a substrate.

FIG. 20 illustrates an exemplary method 2000 of depositing functional blocks into a substrate that has layer of curable adhesive coated thereon according to some of the embodiments of the present invention. At operation 2002, the functional blocks are deposited into a relocating tool that has receptor sites configured to receive the functional blocks. In one example, FSA is used to deposit the functional blocks into the receptor sites in the relocating tool. At operation 2004, the relocating tool having the functional blocks deposited therein can be dried if necessary. At operation 2006, a transfer tool is used to remove the functional blocks from the relocating tool. The transfer tool has nozzles that are in alignment with the receptor sites on the relocating tool such that the transfer tool can accurately couple its nozzles to the functional blocks on the relocating tool to remove them.

At operation 2007, the substrate is coated with a layer of curable adhesive such as epoxy. At operation 2008, the transfer tool is moved over to a substrate. The substrate in this embodiment does not contain any receptor site. At operation 2010, the transfer tool releases the functional blocks into the receptor sites while pressing down on the nozzles to press the functional blocks into the curable adhesive layer. As mentioned above, the transfer tool has non-stick surface (e.g., surface coated with fluoropolymer) so that the pressing of the functional blocks into the substrate does not make the nozzles or other part of the transfer tool sticks to the substrate. A vacuum suction may have been used to secure the functional blocks to the nozzles. In such event, to release the functional blocks, the vacuum is turned off. At operation 2012, the substrate having the functional blocks deposited therein can be dried or cured using, for example, a UV lamp. The curing and drying secure the functional blocks in the substrate.

Figure 21:
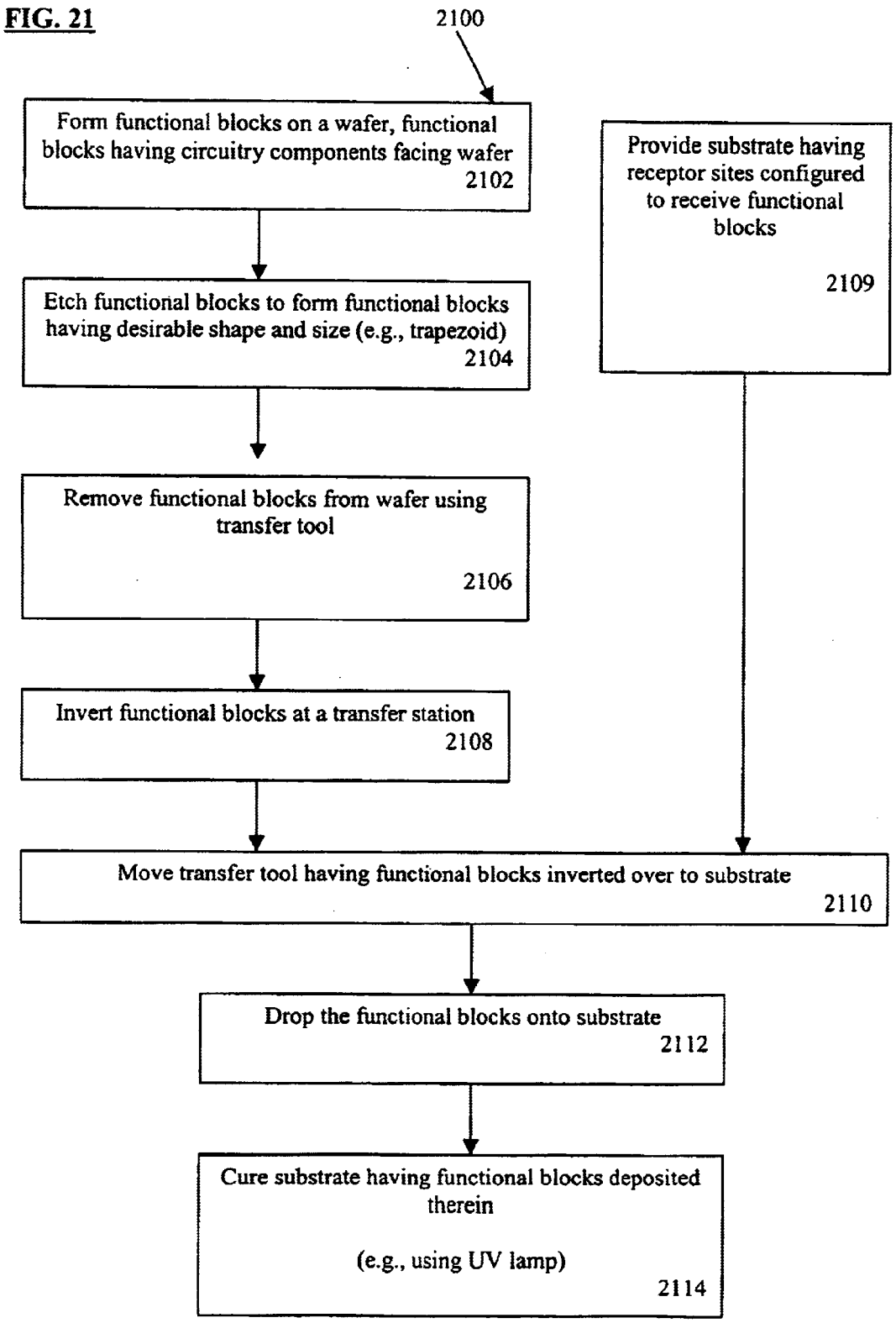
FIG. 21 illustrates an exemplary method of using a transfer tool to transfer blocks formed from a first substrate to a second substrate.

FIG. 21 illustrates an exemplary method 2100 of transferring functional blocks formed on a first substrate to a second substrate according to some of the embodiments of the present invention. At operation 2102, the functional blocks are formed on the first substrate. The first substrate can be a wafer. The functional blocks are formed on the wafer such that the circuitry component parts are facing the surface of the wafer. At operation 2104, conventional etching methods are used to etch the functional blocks into desirable shapes and sizes, for example, trapezoidal shape of any particular size.

At operation 2106, a transfer tool is used to remove the functional blocks from the first substrate. The transfer tool has nozzles that are in alignment with the positions on the wafer where the functional blocks are formed. Note that when the transfer tool removes the functional blocks from the first substrate, the circuitry components formed on the functional blocks are facing away from the transfer tool.

At operation 2108, the functional blocks are dropped into a transfer station and there, they are inverted or flipped. At operation 2110, the transfer tool picks up the functional blocks with the nozzles, and this time, the circuitry components are facing toward the transfer tool. In one example, another transfer tool may be used to pick up the inverted functional blocks and to deposit the functional blocks to the second substrate.

At operation 2109, substrate having receptor sites configured to receive the functional blocks is provided. These receptor sites are in alignment with the nozzles on the transfer tool. At operation 2110, the transfer tool is moved over the substrate. At operation 2110, after the transfer tool is properly registered over substrate, the transfer tool release the functional blocks into the receptor sites. A vacuum suction may have been used to secure the functional blocks to the nozzles. In such event, to release the functional blocks, the vacuum is turned off. The nozzles may press down onto the substrate as discussed above to planarize and secure the function blocks in the receptor sites.

At operation 2112, the substrate having the functional blocks deposited therein can be dried or cured using, for example, a UV lamp. The curing and drying secure the functional blocks in the substrate.

In any of the methods described in FIGS. 13–21, a vibration source coupling to the transfer tool can be used to vibrate or agitate the nozzles of the transfer tool while the functional blocks are being deposited over the receptors sites.

It will be appreciated that the methods and apparatuses described above can be used to make electronic devices such as flat panel displays for computer monitors, liquid crystal display for notebook type computers, display for cellular phone, and display for digital camera and recorded, to name a few.

Figure 22:
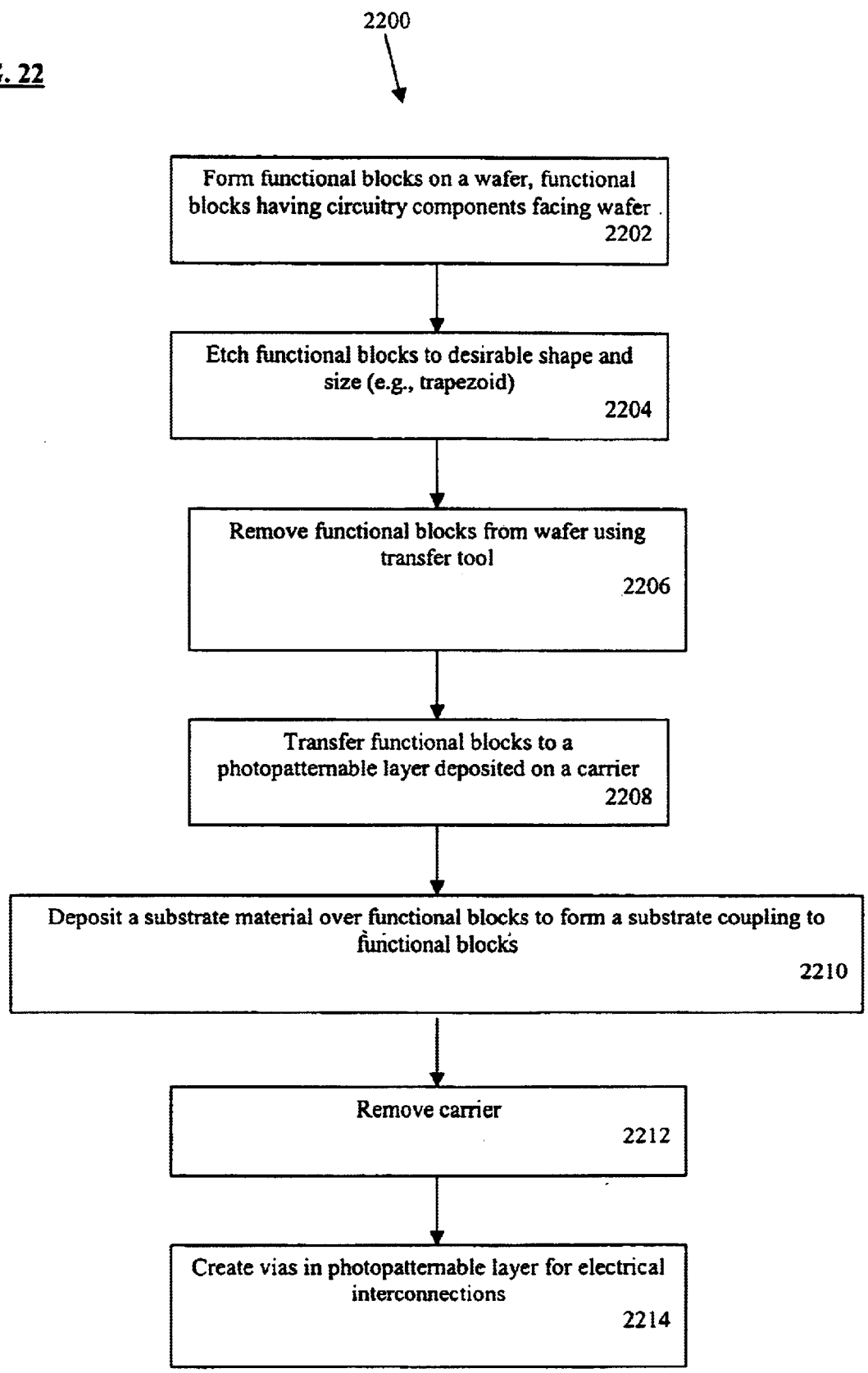
FIG. 22 illustrates another exemplary method of using a transfer tool to transfer blocks formed a first substrate to a second substrate.

FIG. 22 illustrates an exemplary method 2200 of transferring functional blocks formed on a first substrate to a carrier according to some of the embodiments of the present invention. A second substrate is then formed over the functional blocks. At operation 2202, the function blocks are formed on the first substrate. The first substrate can be a wafer. The functional blocks are formed on the wafer such that the circuitry component parts are facing the surface of the wafer. At operation 2204, conventional etching methods are used to etch the function blocks into desirable shapes and sizes, for example, trapezoidal shape of any particular size.

At operation 2206, a transfer tool is used to remove the functional blocks from the first substrate. Note that when the transfer tool removes the functional blocks from the first substrate, the circuitry components formed on the functional blocks are facing away from the transfer tool.

At operation 2208, the functional blocks are transferred, attached, or deposited to a function layer (e.g., a photopatternable layer) deposited on a carrier. At operation 2210, a material that is used to form the second substrate is deposited over the functional blocks. The second substrate in this embodiment does not need to have any receptor sites prior to coupling to the functional blocks. The forming of the second substrate over the functional blocks makes the process of depositing the blocks onto the substrate much more easy since no alignment is necessary.

At operation 2210 the substrate having the functional blocks coupled thereto is inverted and the carrier is removed exposing the photopatternable layer. At operation 2212, conventional methods are used to create contact vias in the photopatternable layer to allow electrical interconnections to the functional blocks.

Although not shown, the second substrate having the functional blocks deposited therein can be dried or cured using, for example, a UV lamp. The curing and drying further secure the functional blocks in the substrate.

In any of the methods described in FIGS. 13–22, a vibration source coupling to the transfer tool can be used to vibrate or agitate the nozzles of the transfer tool while the functional blocks are being deposited over the receptors sites.

It will be appreciated that the methods and apparatuses described above can be used to make electronic devices such as flat panel displays for computer monitors, liquid crystal display for notebook type computers, display for cellular phone, and display for digital camera and recorder, to name a few.

What is claimed is:

1. A method of depositing functional blocks into a substrate comprising:

depositing a plurality of functional blocks into a relocating tool having a first plurality of receptor sites that receive said plurality of functional blocks; and coupling a transfer tool to said relocating tool to transfer said plurality of functional blocks from said relocating tool to a substrate, said transfer tool having a plurality of nozzles aligning with said first plurality of receptor sites wherein said plurality of nozzles attach to said plurality of functional blocks.

2. A method of depositing functional blocks into a substrate as in claim 1 further comprising vibrating said transfer tool to facilitate said transfer.

3. A method of depositing functional blocks into a substrate as in claim 2 wherein said method further comprises:

applying vacuum to said plurality of nozzles to secure said plurality of functional blocks during said transfer.

4. A method of depositing functional blocks into a substrate as in claim 2 comprising:

depositing adhesives into said second plurality of receptor sites prior to depositing said plurality of functional blocks into said second plurality of receptor sites.

5. A method of depositing functional blocks into a substrate as in claim 4 comprising:

vibrating said plurality of nozzles while depositing said plurality of functional blocks into said second plurality of receptor sites.

6. A method of depositing functional blocks into a substrate as in claim 2 comprising:

depositing water droplets over each of said second plurality of receptor sites prior to depositing said plurality of functional blocks into said second plurality of receptor sites.

7. A method of depositing functional blocks into a substrate as in claim 2 comprising:

coating a layer of an adhesive material over said substrate prior to depositing said plurality of functional blocks into said second plurality of receptor sites.

8. A method of depositing functional blocks into a substrate as in claim 1 wherein said substrate comprises a second plurality of receptor sites aligning with said plurality of nozzles and wherein said method further includes depositing one of said plurality of functional blocks into one of said second plurality of receptor sites.

9. A method of depositing functional blocks into a substrate as in claim 1 comprising:

curing said substrate having said plurality of functional blocks deposited therein.

10. A method of depositing functional blocks into a substrate as in claim 1 wherein said curing comprises using a UV lamp to cure said substrate.

11. A method of depositing functional blocks into a substrate as in claim 1 wherein said depositing said plurality of functional blocks into said relocating tool is done with FSA.

12. A method of depositing functional blocks into a substrate as in claim 11 comprising:

depositing water droplets over each of said second plurality of receptor sites prior to depositing said plurality of functional blocks into said second plurality of receptor sites.

13. A method of depositing functional blocks into a substrate as in claim 12 comprising:

submerging said substrate in water such that each of said second plurality of receptor sites is beneath said water while depositing said plurality of functional blocks into said second plurality of receptor sites.

14. A method of depositing functional blocks into a substrate as in claim 12 comprising:

vibrating said plurality of nozzles while depositing said plurality of functional blocks into said second plurality of receptor sites.

15. A method of depositing functional blocks into a substrate as in claim 14 comprising:

vibrating said plurality of nozzles while depositing said plurality of functional blocks into said second plurality of receptor sites.

16. A method of depositing functional blocks into a substrate as in claim 15 comprising:

submerging said substrate in water such that each of said second plurality of receptor sites is beneath said water while depositing said plurality of functional blocks into said second plurality of receptor sites.

17. A method of depositing functional blocks into a substrate as in claim 16 wherein said method further comprises using a force to press said plurality of functional blocks into said substrate.

18. A method of depositing functional blocks into a substrate as in claim 1 wherein said substrate is made out of a thermoplastic or thermoset material and wherein said method further comprising:

heating said substrate to above a softening limit of said material to soften said substrate prior to said transfer.

\* \* \* \* \*

UNITED STATES PATENT AND TRADEMARK OFFICE
CERTIFICATE OF CORRECTION

PATENT NO. : 6,731,353 B1
DATED : May 4, 2004
INVENTOR(S) : Thomas L. Credelle et al.

It is certified that error appears in the above-identified patent and that said Letters Patent is hereby corrected as shown below:

Column 1,
Line 4, please insert -- This invention was made with government support under Contract No. DMEA90-01-C-0009. The government has certain rights to this invention. --.

Signed and Sealed this

Sixteenth Day of August, 2005

JON W. DUDAS
*Director of the United States Patent and Trademark Office*